US012604625B2

(12) United States Patent
Chai

(10) Patent No.: US 12,604,625 B2
(45) Date of Patent: Apr. 14, 2026

(54) DISPLAY PANEL AND DISPLAY DEVICE

(71) Applicants:Wuhan Tianma Microelectronics Co., Ltd., Wuhan (CN); Wuhan Tianma Microelectronics Co., Ltd. Shanghai Branch, Shanghai (CN)

(72) Inventor: Huiping Chai, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 414 days.

(21) Appl. No.: 18/378,694

(22) Filed: Oct. 11, 2023

(65) Prior Publication Data

US 2024/0040871 A1 Feb. 1, 2024

(30) Foreign Application Priority Data

May 31, 2023 (CN) .......................... 202310649999.1

(51) Int. Cl.
*H10K 59/00* (2023.01)
*G09G 3/20* (2006.01)
(Continued)

(52) U.S. Cl.
CPC ............. *H10K 59/131* (2023.02); *G09G 3/20* (2013.01); *H10K 59/38* (2023.02);
(Continued)

(58) Field of Classification Search
CPC ........ H10K 59/131; H10K 59/38; G09G 3/20;

G09G 2300/0426; G09G 2300/0452;
G09G 2300/0819; G09G 2300/0852;
G09G 2300/0861; G09G 2310/061; G09G
2310/0248; G09G 3/3233; H10D 86/441;
H10D 86/60
(Continued)

(56) References Cited

U.S. PATENT DOCUMENTS

2019/0294848 A1* 9/2019 Zeng ...................... G06F 3/0412
2019/0303638 A1* 10/2019 Zeng ...................... G06F 3/0412
(Continued)

FOREIGN PATENT DOCUMENTS

CN 111584599 A 8/2020
CN 113823657 A 12/2021

*Primary Examiner* — Sheikh Maruf
(74) *Attorney, Agent, or Firm* — KDW Firm PLLC

(57) ABSTRACT

A display panel and a display device are provided in the disclosure. A display region of the display panel includes light-emitting elements and pixel circuits. Power signal lines are data signal lines in the display region are electrically connected to the pixel circuits. Part of power signal lines include a first power wiring section including a first power boundary. Part of the data signal lines include a first data wiring section including a first data boundary and a second data wiring section including a second data boundary. In a thickness direction, a pixel electrode overlaps the first power boundary, overlaps the first data boundary, and does not overlap the second data boundary. The minimum distance between the first power boundary and the first data boundary overlapping the same pixel electrode is smaller than the minimum distance between a first virtual boundary and the first power boundary.

20 Claims, 30 Drawing Sheets

(51) Int. Cl.
H10K 59/131         (2023.01)
H10K 59/38          (2023.01)

(52) U.S. Cl.
CPC ............... *G09G 2300/0426* (2013.01); *G09G 2300/0452* (2013.01); *G09G 2300/0819* (2013.01); *G09G 2300/0852* (2013.01)

(58) Field of Classification Search
USPC .......................................................... 257/40
See application file for complete search history.

(56)                    References Cited

U.S. PATENT DOCUMENTS

| | | | | |
|---|---|---|---|---|
| 2020/0184900 | A1* | 6/2020 | Shin | G09G 3/3233 |
| 2020/0243005 | A1* | 7/2020 | Li | G09G 3/3225 |
| 2021/0208633 | A1* | 7/2021 | Ma | H10K 59/131 |
| 2021/0210005 | A1* | 7/2021 | Zhou | G09G 3/325 |
| 2021/0257440 | A1* | 8/2021 | Long | H10D 86/60 |
| 2021/0384226 | A1* | 12/2021 | Xin | H10D 86/60 |
| 2021/0407384 | A1* | 12/2021 | Yuan | G09G 3/32 |
| 2022/0320237 | A1* | 10/2022 | Liu | G06F 3/0412 |
| 2023/0165052 | A1* | 5/2023 | Liu | H04M 1/0266 |
| | | | | 257/40 |

* cited by examiner

<u>300</u>

10/100

400  500  400  500 400  500  400  500  400  500  400 500

210

10/100

310

320

330

340

350

<u>360</u>

362        361

370

210/210(2)/214

500    400

410A/410

600

510A/510

520A/520

210/210(1)

210/210(3)/213

AA'

720G/720          720R/720          720B/720          710

700

800

200

300

210/210G          210/210R          210/210B

<u>300</u>

<u>500</u>

<u>310</u>

D

<u>300</u>

<u>400</u>

430

420

410

F

340

1

10

DISPLAY PANEL AND DISPLAY DEVICE

CROSS-REFERENCE TO RELATED APPLICATION(S)

This application claims the priority of a Chinese Patent Application No. 202310649999.1, filed on May 31, 2023, the disclosure of which is incorporated herein by reference in its entirety.

TECHNICAL FIELD

The present disclosure relates to the field of display panels and, in particular, a display panel and a display device.

BACKGROUND

With the development of display technologies, a full-screen display device almost occupies a large proportion of the consumer product market and becomes a hot topic in the development direction. Taking a mobile phone as an example, smartphones are becoming more and more widely used and have more and more functions and have become an essential electronic device for people's daily life.

The full-screen product has many advantages, but as the screen display region increases, there are many problems in the design of the mobile phone, such as the poor effect of the display device on the acquisition of external light.

SUMMARY

Embodiments of the present disclosure provide a display panel and a display device.

In a first aspect, an embodiment of the present disclosure provides a display panel including a display region including a plurality of light-emitting elements and a plurality of pixel circuits. The plurality of light-emitting elements are electrically connected to the plurality of pixel circuits, respectively.

The display panel further includes a plurality of power signal lines and a plurality of data signal lines located in the display region. The plurality of power signal lines are electrically connected to the plurality of pixel circuits. The plurality of data signal lines are electrically connected to the plurality of pixel circuits. The plurality of power signal lines and the plurality of data signal lines are disposed in the same layer.

A light-emitting element of the plurality of light-emitting elements includes a pixel electrode. A power signal line of at least part of the power signal lines includes a first power wiring section, and a data signal line of at least a part of the data signal lines includes a first data wiring section and a second data wiring section electrically connected to the first data wiring section. The first power wiring section includes a first power boundary adjacent to one side of the first data wiring section. The first data wiring section includes a first data boundary adjacent to one side of the first power wiring section. The second data wiring section includes a second data boundary adjacent to one side of the first power wiring section.

In the thickness direction of the display panel, the pixel electrode overlaps the first power boundary, overlaps the first data boundary, and does not overlap the second data boundary.

The minimum distance between the first power boundary and the first data boundary overlapping the same pixel electrode as the first power boundary is d1. The minimum distance between a first virtual boundary and the first power boundary is d2. d1<d2.

In a first direction, the first virtual boundary overlaps the first power boundary. In a second direction, the first virtual boundary overlaps an extension line of the second data boundary. The first direction intersects the second direction. The plurality of data signal lines are arranged in the first direction. The plurality of data signal lines extend in the second direction.

In a second aspect, an embodiment of the present disclosure provides a display device including the display panel described in the first aspect.

According to the display panel provided in the embodiment of the present disclosure, positions of the power signal line and the data signal line are adjusted. In the thickness direction of the display panel, the pixel electrode overlaps the first power boundary, overlaps the first data boundary, and does not overlap the second data boundary. The minimum distance between the first power boundary and the first data boundary overlapping the same pixel electrode as the first power boundary is smaller than the minimum distance between the first virtual boundary and the first power boundary. That is, part of the data signal lines and part of the power signal lines, a coverage area of the pixel electrode covering the part of the data signal lines and the part of the power signal lines is increased. That is, more regions of the data signal lines and more regions of the power signal lines are disposed in the coverage area of the pixel electrode, thereby ensuring that entire regions in the pixel electrodes are padded by metal wiring to a similar degree, avoiding color cast or dispersion in the display panel, and ensuring the display effect of the display panel.

BRIEF DESCRIPTION OF DRAWINGS

To illustrate the solutions in embodiments of the present disclosure more clearly, the drawings used in the description of the embodiments are briefly described below. Apparently, the drawings described below illustrate only part of the embodiments of the present disclosure, and those of ordinary skill in the art may obtain other drawings based on the drawings described below on the premise that no creative work is done.

DETAILED DESCRIPTION

For a better understanding of the solutions of the present disclosure by those skilled in the art, the solutions in embodiments of the present disclosure will be described clearly and completely in conjunction with the drawings in the embodiments of the present disclosure. Apparently, the embodiments described below are part, not all, of the embodiments of the present disclosure. Based on the embodiments of the present disclosure, other embodiments obtained by those of ordinary skill in the art on the premise that no creative work is done are within the scope of the present disclosure.

It is to be noted that the terms "first", "second" and the like in the description, claims and drawings of the present disclosure are used to distinguish between similar objects and are not necessarily used to describe a particular order or sequence. It should be understood that the data used in this way is interchangeable where appropriate so that the embodiment of the present disclosure described herein may also be implemented in a sequence not illustrated or described herein. Furthermore, the terms "comprising" and "having", as well as any variations thereof, are intended to cover a non-exclusive inclusion, e.g., a system, product, or apparatus that includes a series of elements is not necessarily limited to those elements expressly listed, but may include other elements not expressly listed or inherent to such product or apparatus.

Figure 1:
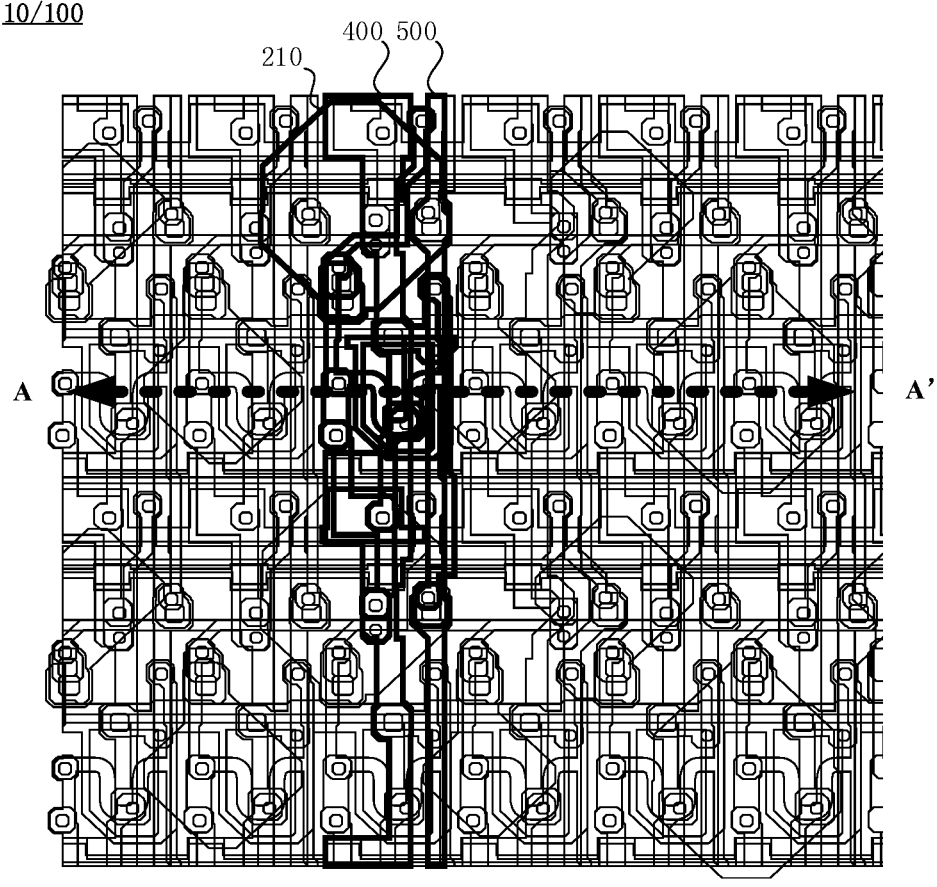
FIG. 1 is a structure diagram of a display panel according to an embodiment of the present disclosure.
Figure 2:
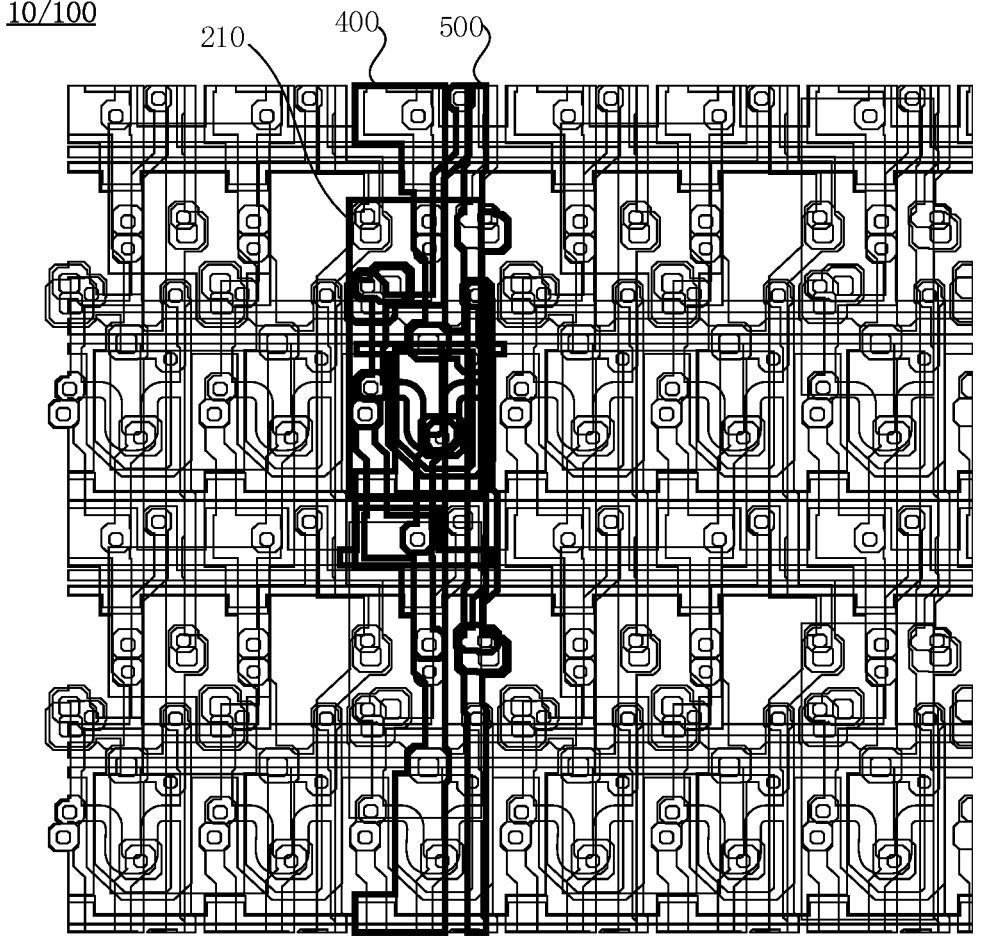
FIG. 2 is a structure diagram of another display panel according to an embodiment of the present disclosure.
Figure 3:
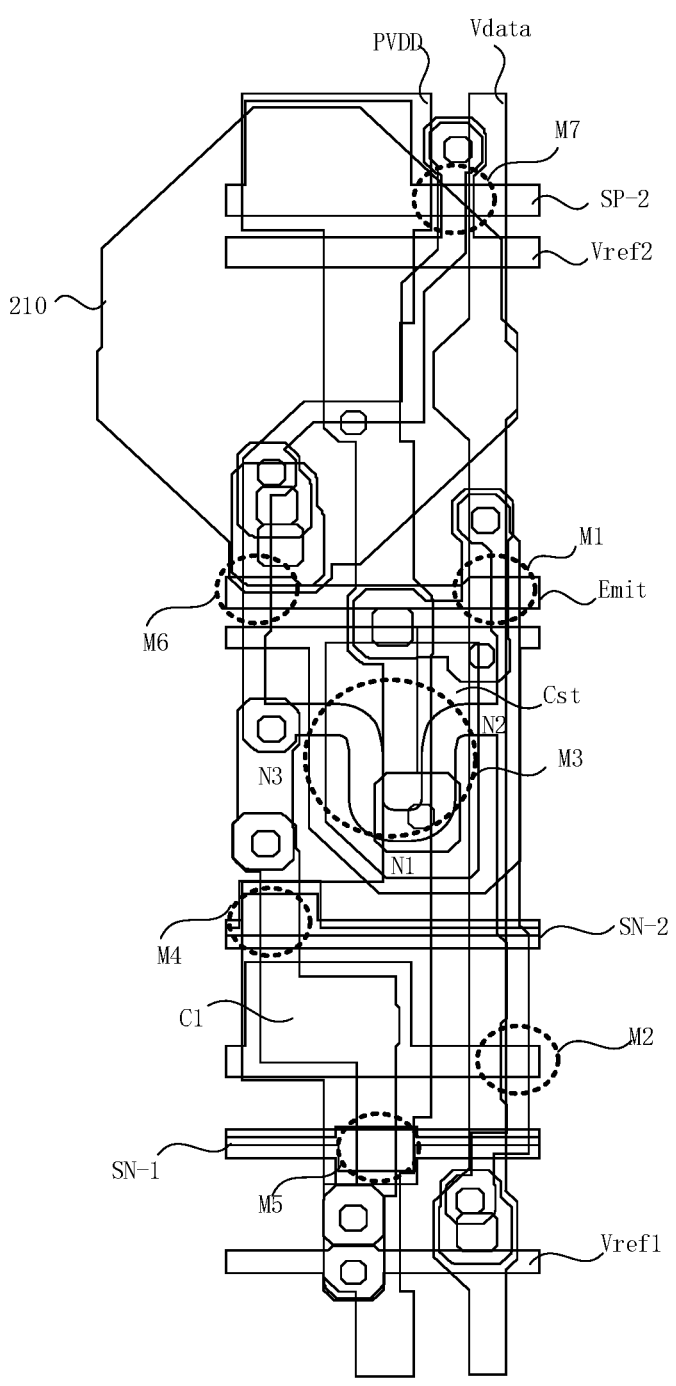
FIG. 3 is an enlarged diagram of a partial region in FIG. 1.
Figure 4:
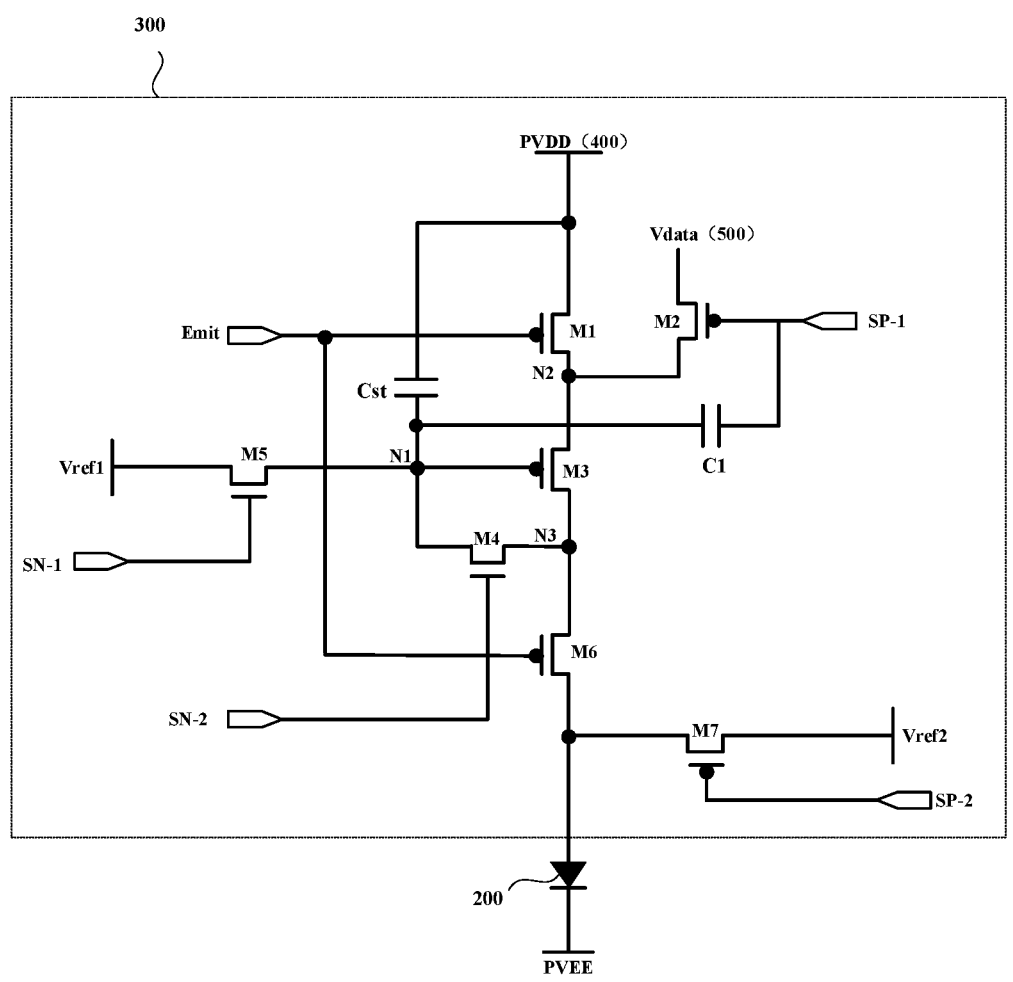
FIG. 4 is a circuit structure diagram of a pixel circuit according to an embodiment of the present disclosure.

FIG. 1 is a structure diagram of a display panel according to an embodiment of the present disclosure. FIG. 2 is a structure diagram of another display panel according to an embodiment of the present disclosure. FIG. 3 is an enlarged diagram of a partial region in FIG. 1. FIG. 4 is a circuit structure diagram of a pixel circuit according to an embodiment of the present disclosure. Referring to FIGS. 1 to 4, an embodiment of the present disclosure provides a display panel 10 including a display region 100. The display region 100 includes multiple light-emitting elements 200 and multiple pixel circuits 300. The multiple light-emitting elements 200 are electrically connected to the multiple pixel circuits 300. The display panel 10 further includes multiple power signal lines 400 (PVDD) and multiple data signal lines 500 (Vdata) located in the display region 100. A power signal line 400 of the multiple power signal lines 400 is electrically connected to a pixel circuit 300. A data signal line 500 of the multiple data signal lines 500 is electrically connected to the pixel circuit 300. The multiple power signal lines 400 and the multiple data signal lines 500 are disposed in the same layer.

Herein, referring to FIGS. 1 and 2, the display panel 10 includes a display region 100 for implementing a display function of the display panel 10. The display region 100 includes multiple light-emitting elements 200 and multiple pixel circuits 300. The pixel circuits 300 are electrically connected to the light-emitting elements 200 so as to achieve the driving of the light-emitting elements 200 by adjusting and controlling the pixel circuits 300, thereby ensuring the display effect of the display panel 10.

Further, as shown in FIGS. 1, 3, and 4, the pixel circuit 300 provided in FIG. 3 is an enlarged diagram of a thickened region in FIG. 1. The embodiment of the present disclosure illustrates by using an example where the pixel circuit 300 includes "7T2C". "T" denotes a transistor. "C" denotes a capacitor. Optionally, in conjunction with the structure diagram and the circuit structure diagram of the pixel circuit 300, the pixel circuit 300 includes a first light-emitting control transistor M1, a data write transistor M2, a driving transistor M3, a threshold compensation transistor M4, an initialization transistor M5, a second light-emitting control transistor M6, a reset transistor M7, a storage capacitor Cst, and a first capacitor C1. Herein, a first scan signal line SN-1 controls the initialization transistor M5 of the driving circuit to be turned on or off, and resets a gate potential of the driving transistor M3 when the initialization transistor M5 is turned on. That is, a first reset signal Vref1 is transmitted to the initialization transistor M5 to reset a connection node (a first node N1) of the driving transistor M3, the initialization transistor M5, the threshold compensation transistor M4, and the storage capacitor Cst. A second scan signal line SP-1 controls the data write transistor M2 of the driving circuit to be turned on or turned off, and a data signal Vdata on a data signal line is written to a gate of the driving transistor M3 when the data write transistor M2 is turned on. A third scan signal line SN-2 controls the threshold compensation transistor M4 to be turned on or off, and a threshold voltage of the driving transistor M3 is compensated when the threshold compensation transistor M4 is turned on. Meanwhile, a fourth scan signal line SP-2 controls the reset transistor M7 to be turned on or off, and an anode of a light-emitting element 200 connected to the pixel circuit 300 is reset when the reset transistor M7 is turned on. That is, a second reset signal Vref2 is transmitted to the anode of the light-emitting element 200. A light-emitting control signal Emit controls the first light-emitting control transistor M1 and the second light-emitting control transistor M6 to be turned on or off, and a power supply signal PVDD is transmitted to the light-emitting element 200 when the first light-emitting control transistor M1 and the second light-emitting control transistor M6 are controlled to be turned on, thereby achieving the display and the light emitting of the light-emitting element 200.

Optionally, the pixel circuit 300 includes a first type transistor and a second type transistor. The first type transistor includes a polysilicon active layer. The second type transistor includes an oxide semiconductor active layer.

Specifically, in the preceding pixel circuit 300, except that the threshold compensation transistor M4 and the initialization transistor M5 are N-type transistors (Indium Gallium Zinc Oxide, IGZO), i.e. the preceding second type transistors, and the oxide semiconductor active layer is included. The rest of the transistors are all P-type transistors (Low Temperature Poly-Silicon, LTPS), i.e. the preceding first type transistors, and the polysilicon active layer is included. The pixel circuit 300 provided in the embodiment of the present disclosure combines the preceding two types of transistors. That is, LTPO is combined with IGZO, i.e. a low temperature polycrystalline oxide (LTPO) display panel technology. The display panel of LTPO not only has the advantages of high resolution, high reaction speed, high brightness, high opening rate and the like of the display panel of LTPS, but also has the advantages of low production cost and low power consumption of the display panel of IGZO.

The display panel 10 includes multiple power signal lines 400 (PVDD) and multiple data signal lines 500 (Vdata) located in the display region 100. The power signal line 400 is electrically connected to the pixel circuit 300. The data signal line 500 is electrically connected to the pixel circuit 300.

Figure 5:
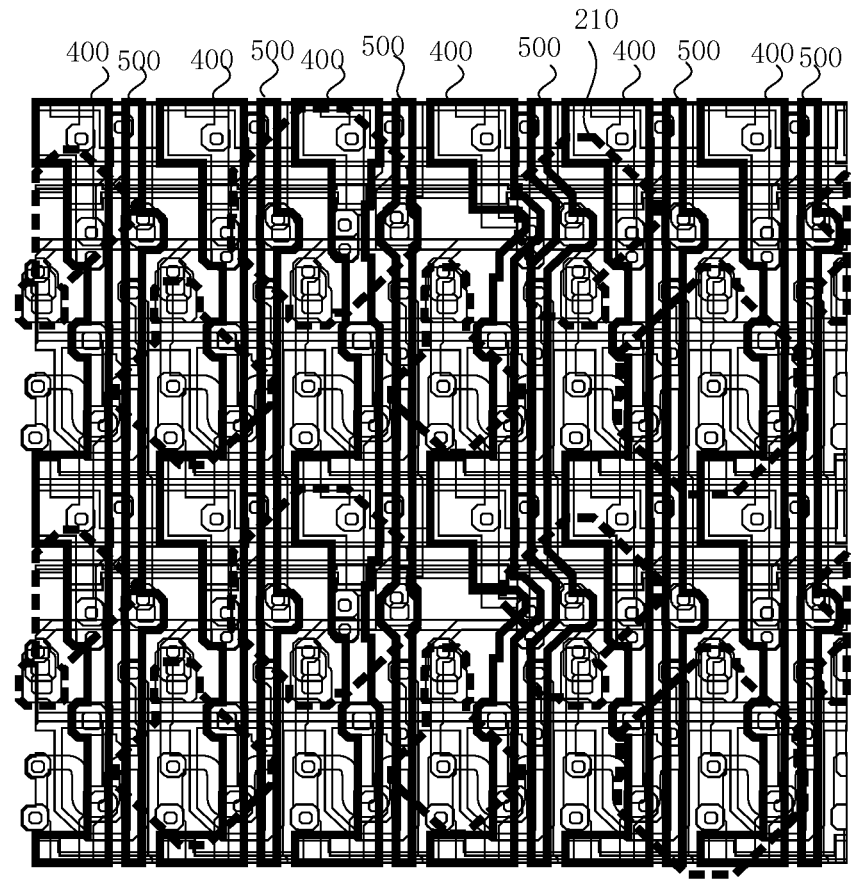
FIG. 5 is a structure diagram of another display panel according to an embodiment of the present disclosure.
Figure 6:
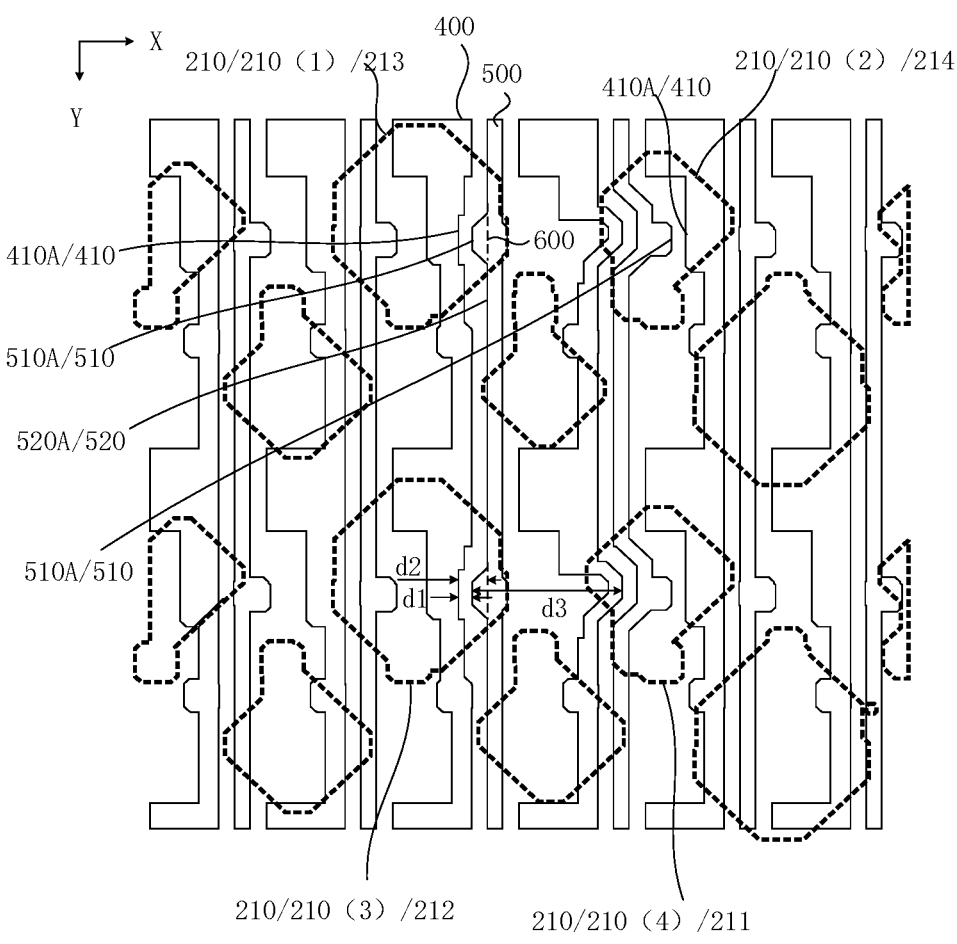
FIG. 6 is a schematic diagram of a portion of the structure of a pixel circuit in the display panel in FIG. 5.
Figure 7:
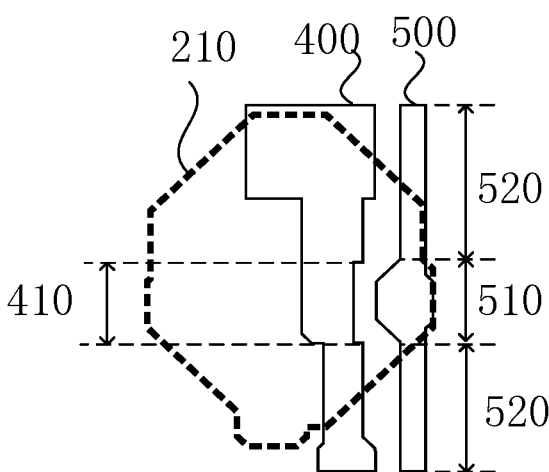
FIG. 7 is an enlarged diagram of a portion of the structure of a pixel circuit in FIG. 6.
Figure 8:
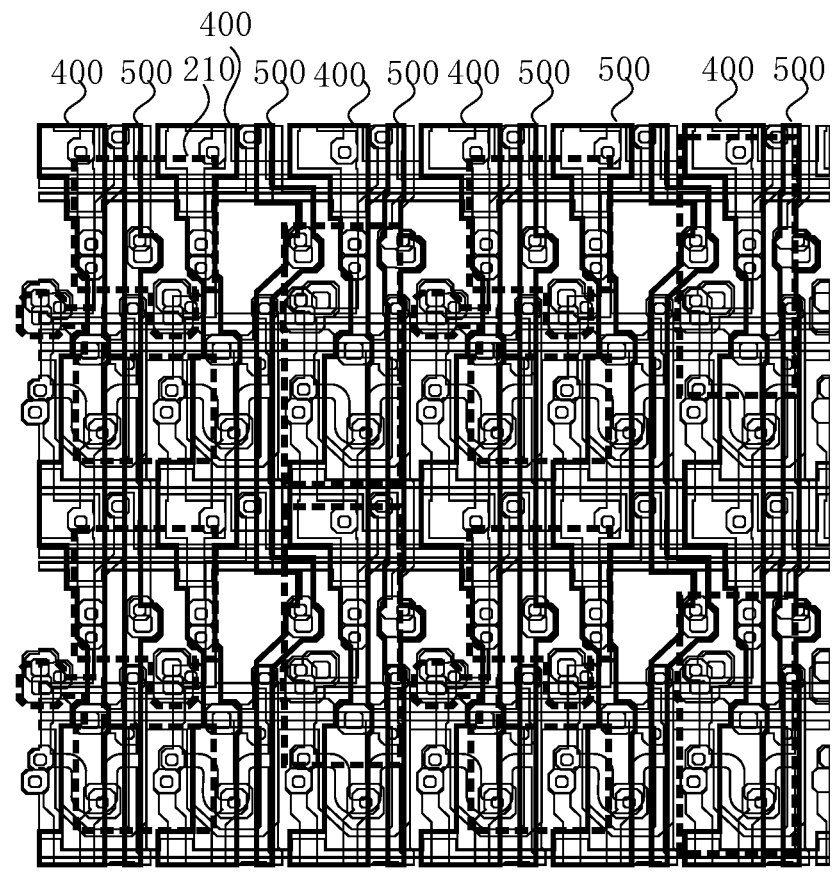
FIG. 8 is a structure diagram of another display panel according to an embodiment of the present disclosure.
Figure 9:
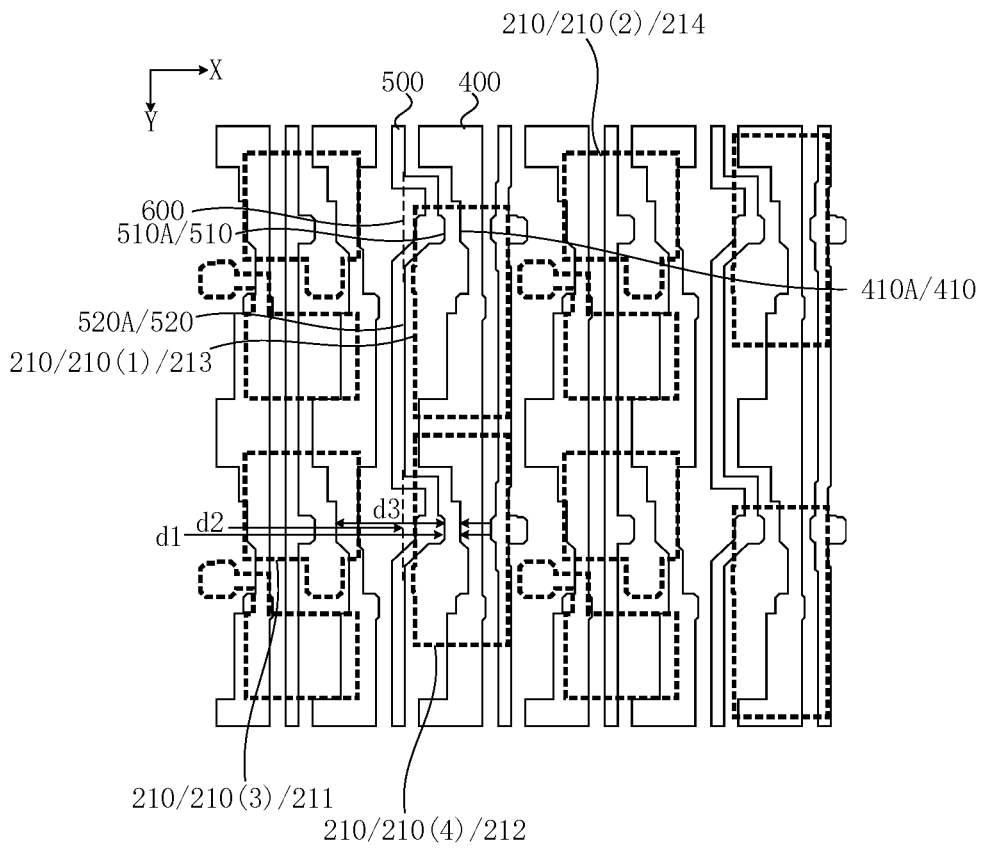
FIG. 9 is a schematic diagram of a portion of the structure of a pixel circuit in a display panel in FIG. 8.
Figure 10:
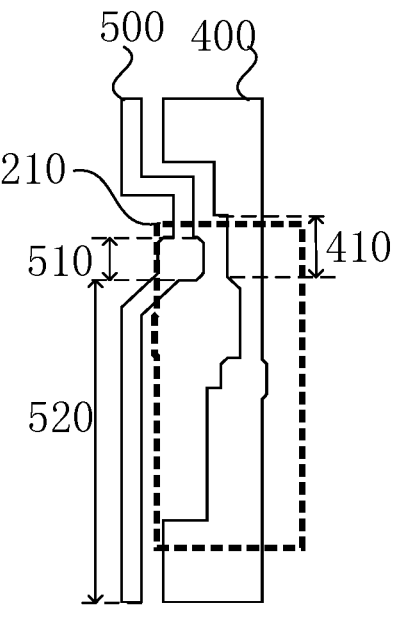
FIG. 10 is an enlarged diagram of a portion of the structure of a pixel circuit in FIG. 9.

FIG. 5 is a structure diagram of another display panel according to an embodiment of the present disclosure. FIG. 6 is a schematic diagram of a portion of the structure of a pixel circuit in a display panel in FIG. 5. FIG. 7 is an enlarged diagram of a portion of the structure of a pixel circuit in FIG. 6. FIG. 8 is a structure diagram of another display panel according to an embodiment of the present disclosure. FIG. 9 is a schematic diagram of a portion of the structure of a pixel circuit in a display panel in FIG. 8. FIG. 10 is an enlarged diagram of a portion of the structure of a pixel circuit in FIG. 9. Referring to FIGS. 1 to 10, the light-emitting element 200 includes a pixel electrode 210. The power signal line 400 of at least part of the power signal lines 400 includes a first power wiring section 410. The data signal line 500 of at least a part of the data signal lines 500 includes a first data wiring section 510 and a second data wiring section 520 electrically connected to the first data wiring section 510. The first power wiring section 410 includes a first power boundary 410A adjacent to one side of the first data wiring section 510. The first data wiring section 510 includes a first data boundary 510A adjacent to one side of the first power wiring section 410. The second data wiring section 520 includes a second data boundary 520A adjacent to one side of the first power wiring section 410. In the thickness direction of the display panel 10, the pixel electrode 210 overlaps the first power boundary 410A, overlaps the first data boundary 510A, and does not overlap the second data boundary 520A. The minimum distance between the first power boundary 410A and the first data boundary 510A overlapping the same pixel electrode 210 as the first power boundary 410A is d1. The minimum distance between a first virtual boundary 600 and the first power boundary 410A is d2. d1<d2. In a first direction X, the first virtual boundary 600 overlaps the first power boundary 410A. In a second direction Y, the first virtual boundary 600 overlaps an extension line of the second data boundary 520A. The first direction X intersects the second direction Y The multiple data signal lines 500 are arranged in the first direction X, and the multiple data signal lines 500 extend in the second direction Y.

Specifically, the arrangement of pixel electrodes 210 in the display panel 10 has diversity. Referring to FIGS. 1 to 8, the arrangement of pixel electrodes 210 in the display panel 10 in FIGS. 1, 5, 6, and 7 is different from the arrangement of pixel electrodes 210 in the display panel 10 in FIGS. 2, 8, 9, and 10. Exemplarily, the arrangement of pixel electrodes 210 in the display panel 10 in FIGS. 1, 5, 6, and 7 may be referred to as "pyramid arrangement". The arrangement of pixel electrodes 210 of the display panel 10 in FIGS. 2, 8, 9, and 10 may be referred to as "π arrangement". Based on the specific arrangement of the pixel electrodes 210 in the display panel 10, the arrangement of the pixel electrodes 210 in the display panel 10 can be adaptively adjusted according to the actual production requirements. This embodiment of the present disclosure does not specifically limit thereto.

Specifically, as shown in FIGS. 7 and 10, each of part of the power signal lines 400 of the display panel 10 includes a first power wiring section 410. Each of part of the data signal lines 500 of the display panel 10 includes a first data wiring section 510 and a second data wiring section 520. The first data wiring section 510 is electrically connected to the second data wiring section 520. That is, the relative position among the first power wiring section 410, the first data wiring section 510, and the second data wiring section 520 is adjusted, increasing the overlapping area of the pixel electrode 210 and the metal wiring. That is, the metal wiring area overlapped by the pixel electrode 210 is ensured to be balanced, entire regions in the pixel electrodes 210 are padded by metal wiring to a similar degree, thereby avoiding color cast or dispersion in the display panel 10, and ensuring the display effect of the display panel 10.

Specifically, the first power wiring section 410 includes the first power boundary 410A. The first data wiring section 510 includes the first data boundary 510A. The second data wiring section 520 includes the second data boundary 520A. The first power boundary 410A is adjacent to one side of the first data wiring section 510. The first data boundary 510A and the second data boundary 520A are adjacent to one side of the first power wiring section 410. Herein, by adjusting positions of the first data boundary 510A, the second data boundary 520A, and the first power boundary 410A, that is, by adjusting the boundary of the data signal line 500 close to the power signal line 400, it is ensured that there exists more overlapping between the data signal line 500 and the pixel electrode 210 in the thickness direction of the display panel 10, and it is ensured that there exists more overlapping area between the pixel electrode 210 and the metal wiring.

Specifically, the case where the pixel electrodes 210 are in the "pyramid arrangement" is used as an example. As shown in FIGS. 5 to 7, in the thickness direction of the display panel 10, the case where the power signal line 400 and the data signal line 500 that overlap a pixel electrode 210 (1) is used as an example. The power signal line 400 at this position includes the first power wiring section 410 and the first power wiring section 410 includes the first power boundary 410A. The data signal line 500 at this position includes the first data wiring section 510 and the second data wiring section 520 and the corresponding wiring sections include the first data boundary 510A and the second data boundary 520A. The first power boundary is adjacent to one side of the first data wiring section 510. The first data boundary 510A and the second data boundary 520A are adjacent to one side of the first power wiring section 410. In the thickness direction of the display panel 10, the position comparison is performed on the pixel electrode 210 (1). The pixel electrode 210 (1) overlaps the first power boundary 410A, overlaps the first data boundary 510A, and does not overlap the second data boundary 520A. That is, it can be understood that the position of the data signal line 500 is adjusted to bend the first data wiring section 510 at the position of the first data boundary 510A toward one side of the first power wiring section 410, causing a position difference between the pixel electrode 210 (1) and the second data wiring section 520 at the position of the second data boundary 510B, thereby increasing the overlapping area between the pixel electrode 210 and the metal wiring.

Further, the case where the pixel electrodes 210 are in the "π arrangement" is used as an example. Referring FIGS. 8 to 10, in the thickness direction of the display panel 10, the position comparison is performed on the pixel electrode 210 (1). The pixel electrode 210 (1) overlaps the first power boundary 410A, overlaps the first data boundary 510A, and does not overlap the second data boundary 520A. That is, it can be understood that the position of the data signal line 500 is adjusted to bend the first data wiring section 510 at the position of the first data boundary 510A toward one side of the first power wiring section 410, causing a position difference between the pixel electrode 210 (1) and the second data wiring section 520 at the position of the second data boundary 510B, thereby increasing the overlapping area between the pixel electrode 210 and the metal wiring.

On this basis, since two different types of transistors are provided in the display panel 10, the arrangement of a film in which the transistors are located and the arrangement of the scan lines connected to the transistors and the data lines connected to the transistors occupy the spare space in some pixel circuits 300. Meanwhile, the development trend of the display panel 10 is to develop towards a full screen. That is, some light-acquisition devices are disposed in the display region 100. That is, face identification or capturing of the display panel 10 can also be achieved while achieving the display effect of the display panel 10. If the transistors and the signal lines connected to the transistors occupy too much spare space in the display panel 10, the light-transmitting effect of the display panel 10 is affected. That is, the face identification and the capturing effect of the display panel 10 are affected. Therefore, the display panel 10 provided in the embodiment of the present disclosure can adjust positions of the data signal line 500 connected to the pixel circuit 300 and the power signal line 400 connected to the pixel circuit 300. The light-transmitting effect of the display panel 10 in the light-transmitting region can be ensured while ensuring the display effect of the display panel 10.

Further, in a pixel electrode 210 (2), the area of the metal wiring overlapping a pixel electrode 210 (2) is also increased by adjusting the wiring manner of the metal wiring, thereby avoiding color cast or dispersion in the display panel 10, and ensuring the display effect of the display panel 10. That is, it is ensured that the line width of the metal wiring whose wiring manner is changed is unchanged and it is ensured that the space occupied by the metal wiring between the pixel electrode 210 (1) and the pixel electrode 210 (2) is reduced and the overlapping areas between the data signal line 500 and the pixel electrode 210 and between the power signal line 400 and the pixel electrode 210 are increased, thereby increasing the area of the overall light-transmitting region of the display panel 10.

Further, the case where the pixel electrodes 210 are in the "π arrangement" is used as an example. Referring to FIGS. 8 to 10, in the thickness direction of the display panel 10, the first data wiring section 510 is bent toward one side of the first power wiring section 410, and the overall line width of the first data wiring section 510 is ensured to be unchanged as far as possible, thereby increasing the contact area between the first data wiring section 510 and the pixel electrode 210, avoiding color cast or dispersion in the display panel 10, and ensuring the display effect of the display panel 10. Meanwhile, since the line width of the first data wiring section 510 is not changed as much as possible, the overlapping area of the first data wiring section 510 where the first data wiring section 510 does not overlap the pixel electrode 210 is reduced, thereby improving the area of the light-transmitting region of the display panel 10, and improving the overall light transmittance of the display panel 10.

Further, as shown in FIGS. 6 and 9, the minimum distance between the first power boundary 410A and the first data boundary 510A overlapping the same pixel electrode 210 as the first power boundary 410A is d1. The minimum distance between the first virtual boundary 600 and the first power boundary 410A is d2. The first virtual boundary 600 may represent a position in which the first data boundary 510A is originally located if the first data boundary 510A is not moved. Herein, d1<d2, i.e. reflecting that the minimum distance between the first power boundary 410A and the first data boundary 510A overlapping the same pixel electrode 210 as the first power boundary 410A is reduced, and also reflecting that the data signal wiring 500 moves toward one side close to the first power wiring section 410, thereby increasing the overlapping area between the pixel electrode 210 and the metal wiring. It is to be noted that for the comparison of the distance between the first power boundary 410A and the first data boundary 510B, the power signal line 400 can be compared with the data signal line 500 on the right side, or the power signal line 400 may be compared with the data signal line 500 on the left side.

Figure 11:
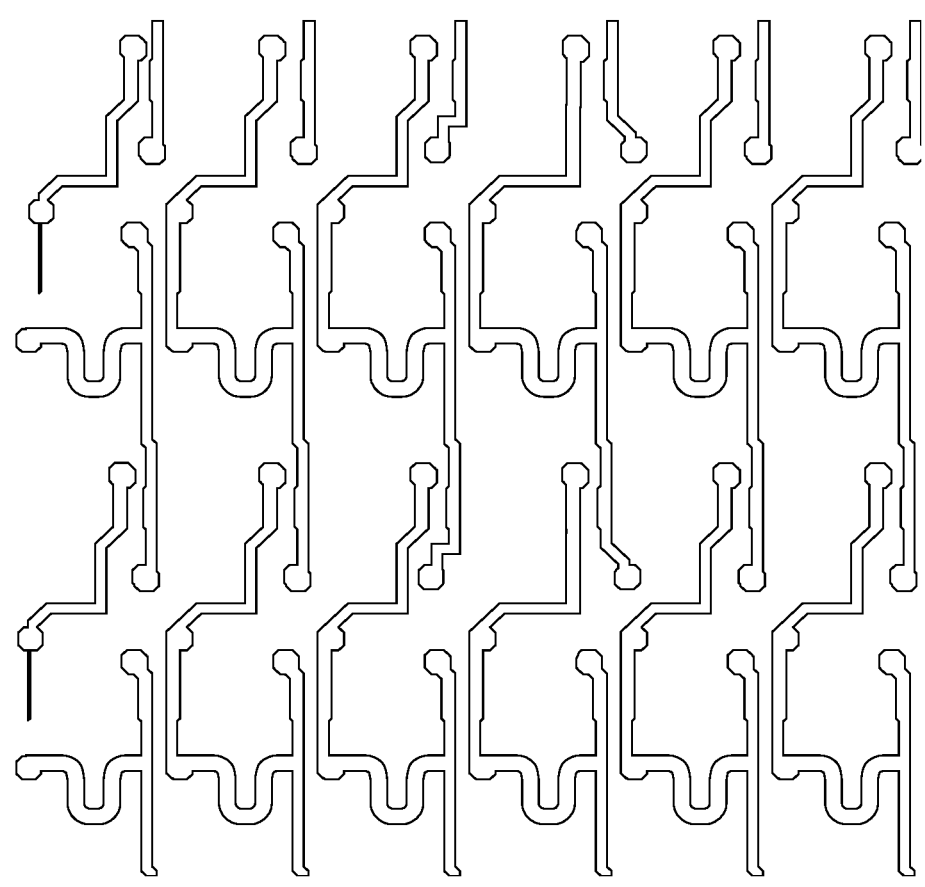
FIG. 11 is a schematic diagram of another portion of the structure of a pixel circuit in a display panel in FIG. 5.
Figure 12:
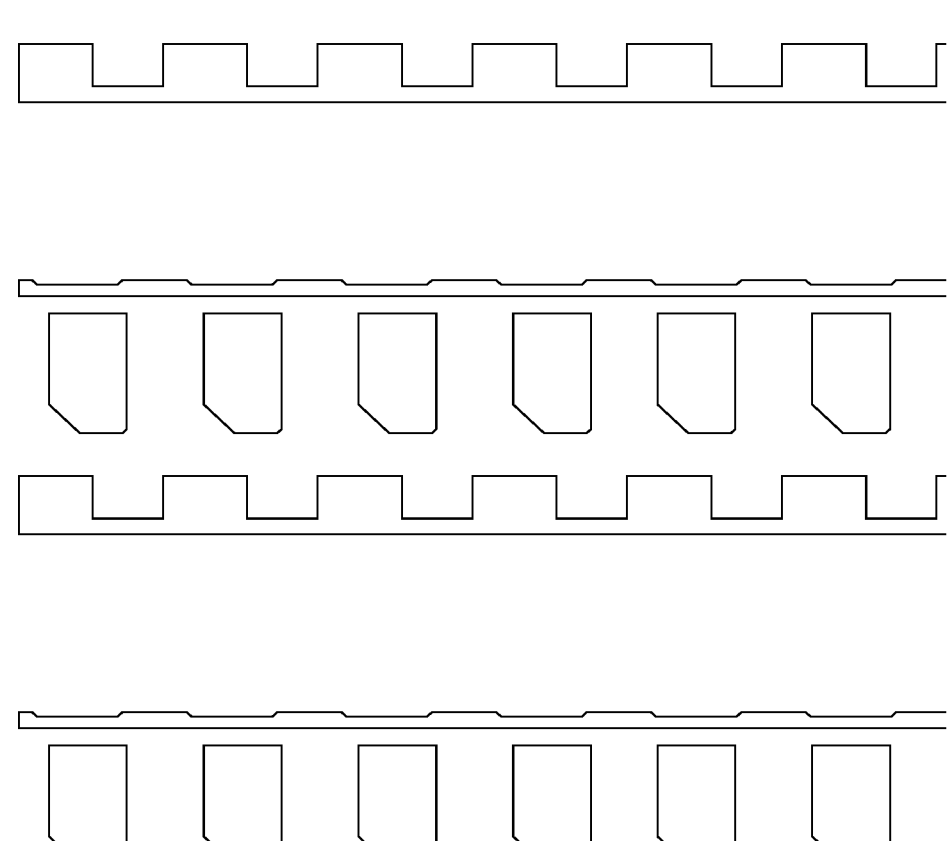
FIG. 12 is a schematic diagram of another portion of the structure of a pixel circuit in a display panel in FIG. 5.
Figure 13:
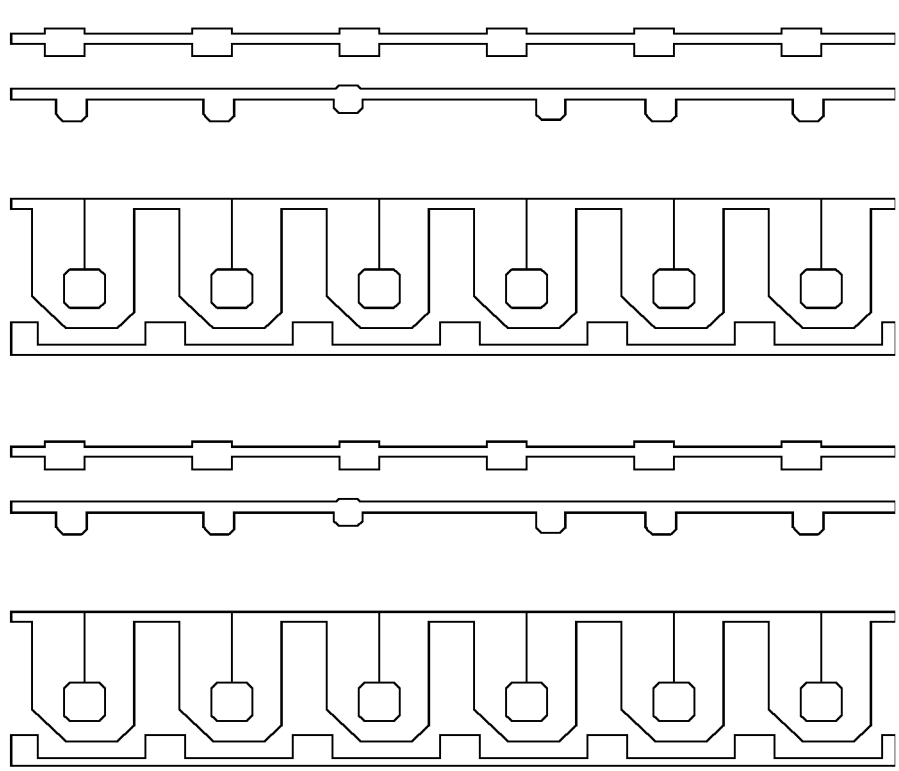
FIG. 13 is a schematic diagram of another portion of the structure of a pixel circuit in a display panel in FIG. 5.
Figure 14:
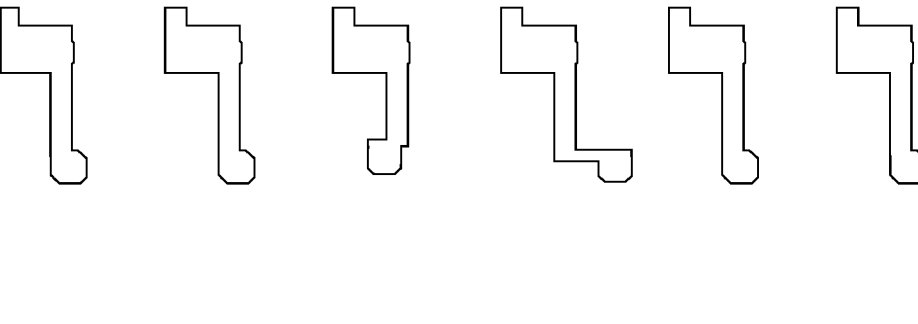
FIG. 14 is a schematic diagram of another portion of the structure of a pixel circuit in a display panel in FIG. 5.
Figure 14:
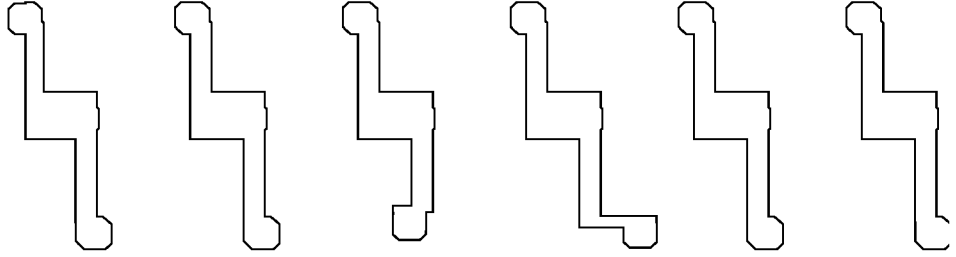
Figure 15:
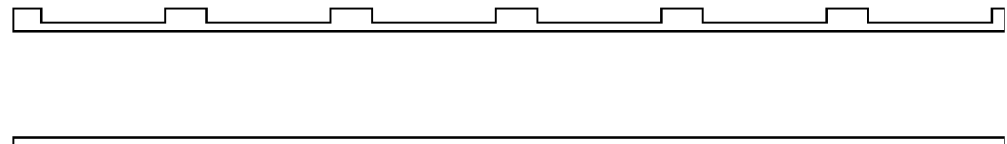
FIG. 15 is a schematic diagram of another portion of the structure of a pixel circuit in a display panel in FIG. 5.
Figure 16:
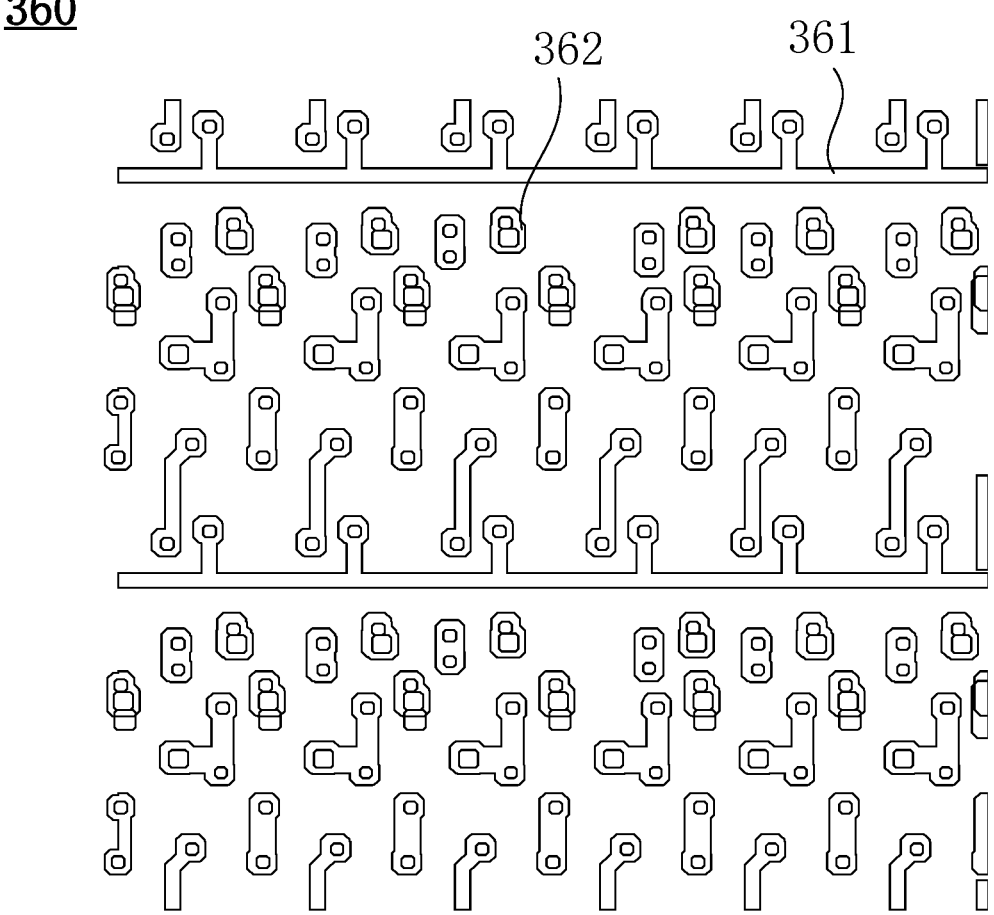
FIG. 16 is a schematic diagram of another portion of the structure of a pixel circuit in a display panel in FIG. 5.
Figure 17:
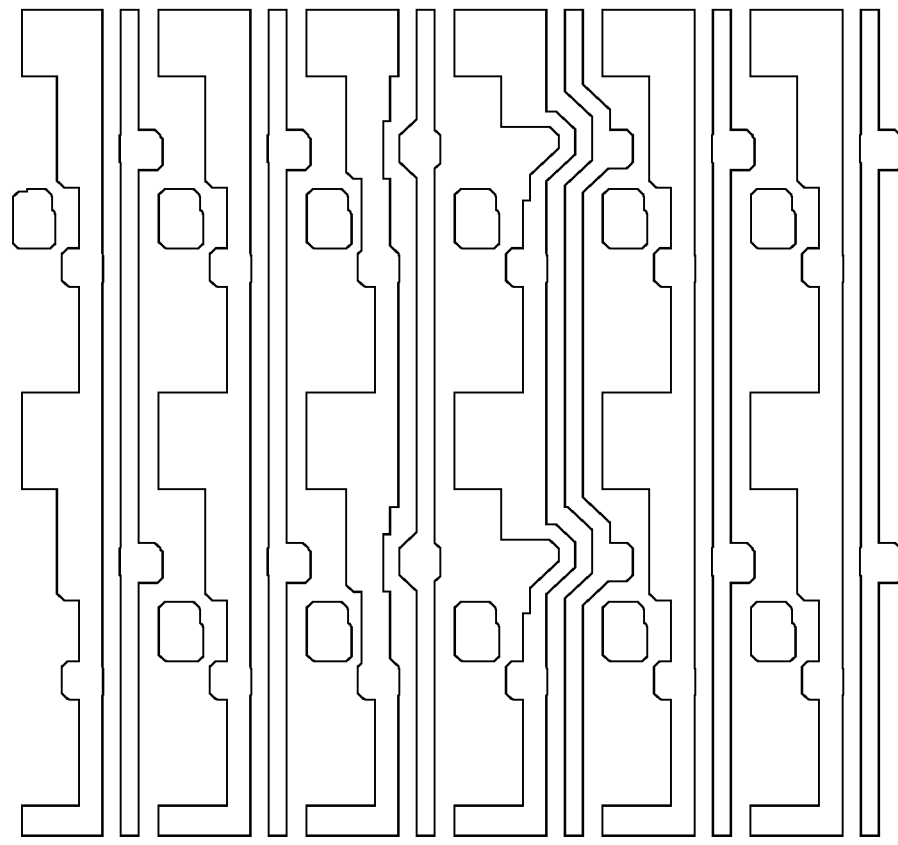
FIG. 17 is a schematic diagram of another portion of the structure of a pixel circuit in a display panel in FIG. 5.

Further, FIG. 11 is a schematic diagram of another portion of the structure of a pixel circuit in FIG. 5. FIG. 12 is a schematic diagram of another portion of the structure of a pixel circuit in FIG. 5. FIG. 13 is a schematic diagram of another portion of the structure of a pixel circuit in FIG. 5. FIG. 14 is a schematic diagram of another portion of the structure of a pixel circuit in FIG. 5. FIG. 15 is a schematic diagram of another portion of the structure of a pixel circuit in FIG. 5. FIG. 16 is a schematic diagram of another portion of the structure of a pixel circuit in FIG. 5. FIG. 17 is a schematic diagram of another portion of the structure of a pixel circuit in FIG. 5. Referring to FIGS. 1 to 15, each of FIGS. 1, 2, 5, and 8 shows an overall structure diagram of a pixel circuit to clearly understand specific arrangement positions of films. Referring to FIGS. 11 to 17, different films in the pixel circuit are exemplified one by one from bottom to the top.

Specifically, as shown in FIGS. 1 to 17, the pixel circuit sequentially includes a first active layer 310, a first metal layer 320, a capacitor metal layer 330, a second active layer 340, a gate metal layer 350, a second metal layer 360, and a third metal layer 370. Moreover, in conjunction with FIG. 2, the first active layer 310 may be a film in which active layers of the first light-emitting control transistor M1, the data write transistor M2, the driving transistor M3, the second light-emitting control transistor M6, and the reset transistor M7 are located. The first metal layer 320 may be a film in which gate layers of the first light-emitting control transistor M1, the data write transistor M2, the driving transistor M3, the second light-emitting control transistor M6, and the reset transistor M7 are located and may be a film in which lower substrates of the storage capacitor Cst and the first capacitor C1 are located. Moreover, the light-emitting control signal Emit, the second scan signal line SP-1, and the fourth scan signal line SP-2 are also located in the first metal layer 320. The capacitor metal layer 330 is a film in which an upper substrate of the storage capacitor Cst is located. The first reset signal Vref1 is located in the capacitor metal layer 330. The second active layer 340 may be a film in which active layers of the threshold compensation transistor M4 and the initialization transistor M5 are located and may also be a film in which an upper substrate of the first capacitor C1 is located. Gate layers of the threshold compensation transistor M4 and the initialization transistor M5 include a bottom gate structure located in the capacitor metal layer 330 and a top gate structure located in the gate metal layer 350. First scan signal lines SN-1 include signal lines located in the capacitor metal layer 330 and signal lines located in the gate metal layer 350. Third scan signal lines SN-2 include signal lines located in the capacitor metal layer 330 and signal lines located in the gate metal layer 350. Further, the metal wiring 361 in the second metal layer 360 is used for transmitting the second reset signal Vref2. Meanwhile, the cross-over via processing of different films may be achieved by the reset of connection portions 362 in the second metal layer 360. It should be noted that the connection portions 362 has a diversity based on different arrangement positions of the different films. Further, both the power signal line 400 and the data signal line 500 are prepared by the third metal layer 370. Further, referring to FIGS. 2 and 17, specific positions of different transistors in the pixel circuit 300 are exemplarily shown.

In summary, in the display panel provided in the embodiment of the present disclosure, the positions of the power signal line and the data signal line are adjusted, in the thickness direction of the display panel, the pixel electrode overlaps the first power boundary, overlaps the first data boundary, and does not overlap the second data boundary, and the minimum distance between the first power boundary and the first data boundary overlapping the same pixel electrode as the first power boundary is smaller than the minimum distance between the first virtual boundary and the first power boundary. That is, part of the data signal lines and part of the power signal lines are adjusted, increasing a coverage area of the pixel electrode on part of the data signal lines and part of the power signal lines. That is, more regions of the data signal lines and more regions of the power signal lines are disposed in the coverage area of the pixel electrode, thereby ensuring that entire region are padded by metal wiring in the pixel electrodes 210 to a similar degree, avoiding color cast or dispersion in the display panel, and ensuring the display effect of the display panel.

Referring to FIGS. 6 and 9, the plurality of pixel electrodes comprises two pixel electrodes adjacently disposed in the first direction X. The two pixel electrodes 210 adjacently disposed in the first direction X include a first pixel electrode 211 and a second pixel electrode 212. The maximum distance d3 between the first power boundary 410A overlapping the first pixel electrode 211 and the first data boundary 510A overlapping the second pixel electrode 212, where d3>d2.

Herein, in the thickness direction of the display panel 10, different pixel electrodes 210 overlap different first power supply boundaries and different first data boundaries 510A. Exemplarily, as shown in FIGS. 6 and 9, in the first direction X, two adjacent pixel electrodes 210 are illustrated by using the pixel electrode 210 (3) and the pixel electrode 210 (4) as an example. The maximum distance between the first power boundary 410A overlapping the pixel electrode 210 (3) and the first data boundary 510A overlapping the pixel electrode 210 (4) is d3. The minimum distance between the first virtual boundary 600 and the first power boundary 410A is d2. If d3>d2, i.e. reflecting that positions of part of the first data boundary 510A and part of the first power boundary 410 are adjusted, specifically, the first power boundary 410A is adjusted toward the pixel electrode 210 overlapping the first power boundary 410A, the first data boundary 510A is adjusted toward the pixel electrode 210 overlapping the first data boundary 510A, and based on the adjusted first power boundary 410A and the adjusted first data boundary 510A overlapping different pixel electrodes 210, the direct distance between the first power boundary 410A and the first data boundary 510A is increased. That is, the distance between the first data boundary 510A overlapping the pixel electrode 210 (3) and the first power boundary 410A overlapping the pixel electrode 210 (4) is increased, and this region does not overlap the pixel electrodes 210. If the area of this region is increased, it is possible to reduce the space occupied by the wiring in the display panel 10, increase the area of the light-transmitting region of the display panel 10, and ensure the light-transmitting effect of the display panel 10.

Referring to FIGS. 6 and 9, the pixel electrodes 210 includes a third pixel electrode 213 and a fourth pixel electrode 214. An area of a region in the third pixel electrode 213 overlapping the first power wiring section 410 and the first data wiring section 510 is S1, and an area of the third pixel electrode 213 is S2. An area of a region in the fourth pixel electrode 214 overlapping the first power wiring section 410 and the first data wiring section 510 is S3, and an area of the fourth pixel electrode 214 is S4. |(S1/S2)−(S3/S4)|/(S1/S2)≤50%.

Herein, based on different display panels 10 having different arrangement manners of pixel electrodes 210, differences in the arrangement manners of different display panels 10 may be reflected in the arrangement positions of the pixel electrodes 210, or may be reflected in the arrangement areas of the pixel electrodes 210. Exemplarily, referring to FIG. 6, the pixel electrodes 210 are in the "pyramid arrangement". Referring to FIG. 9, the pixel electrodes 210 are in the "π arrangement". The arrangement of pixel electrodes 210 in the actual display panel 10 may be of other types and is not shown in the embodiment of the present disclosure.

Further, in the display panel 10, the pixel electrodes 210 include a first pixel electrode 211 and a second pixel electrode 212. The first pixel electrode 211 overlaps part of the power signal line 400 and part of the data signal lines 500. The second pixel electrode 212 overlaps part of the power signal line 400 and part of the data signal lines 500. Further, an area of a region in the first pixel electrode 211 overlapping the first power wiring section 410 and the first data wiring section 510 is S1. An area of the first pixel electrode 211 is S2. Meanwhile, an area of a region in the second pixel electrode 212 overlapping the first power wiring section 410 and the first data wiring section 510 is S3. An area of the second pixel electrode 212 is S4. |(S1/S2)−(S3/S4)|/(S1/S2)≤50%. That is, a ratio of the area of the first pixel electrode 211 to the area of a region of the power signal line 400 and the data signal line 500 that overlap the first pixel electrode 211 is approximately equal to a ratio of the area of the second pixel electrode 212 to the area of a region of the power signal line 400 and the data signal line 500 that overlap the second pixel electrode 212. Meanwhile, the power signal line 400 and the data signal line 500 are prepared in the same film, reflecting that the unevenness of each pixel electrode 210 due to the film in which the power signal line 400 is located is similar, and the transmission optical path of the light at each pixel electrode 210 is similar. It can be considered that each pixel electrode 210 is padded by the pixel circuit 300 to a similar degree, thereby avoiding color cast or dispersion in the display panel 10, and ensuring the display effect of the display panel 10.

Figure 18:
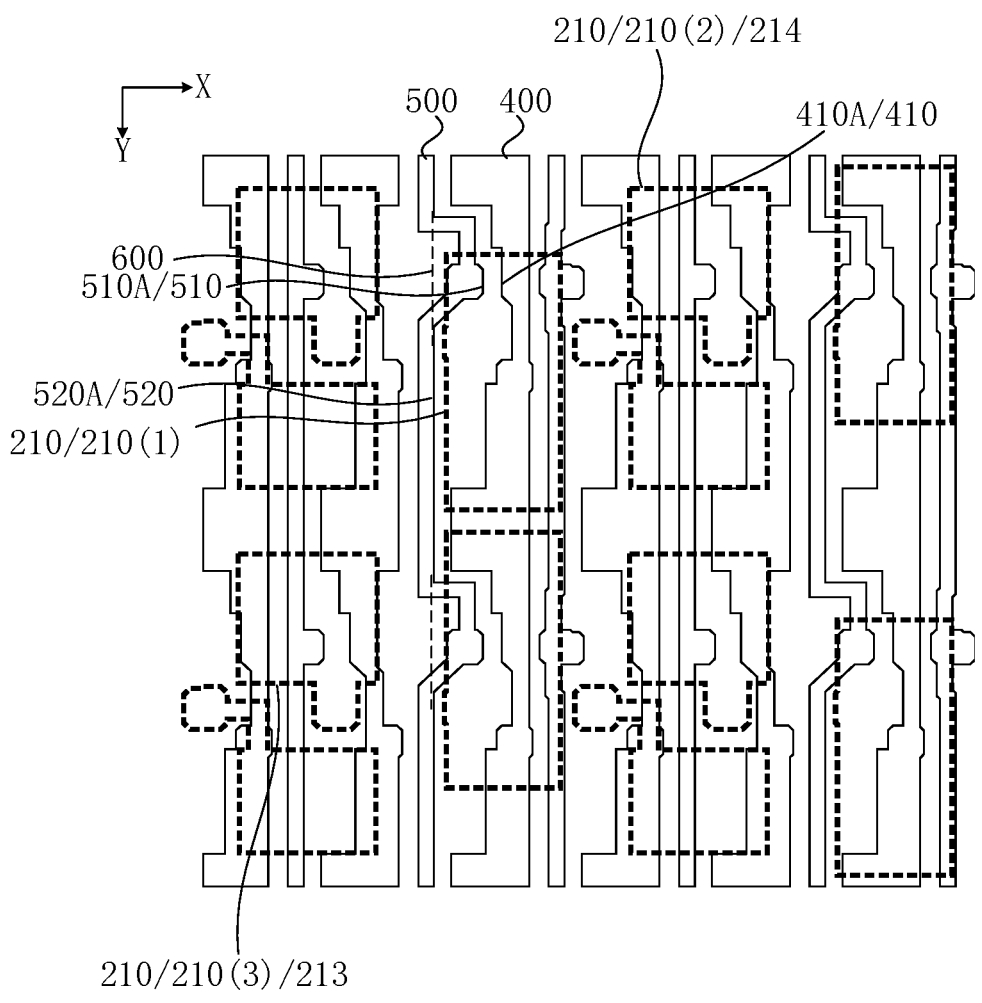
FIG. 18 is a schematic diagram of a portion of the structure of a pixel circuit in FIG. 8.

FIG. 18 is a schematic diagram of a portion of the structure of a pixel circuit in FIG. 8. Referring to FIGS. 8, 9, and 18, a third pixel electrode 213 and a fourth pixel electrode 214 are provided, where S1/S2=S3/S4.

Further, a ratio of the area of the third pixel electrode 213 to the area of a region in the power signal line 400 and the data signal line 500 that overlap the third pixel electrode 213 may be exactly equal to a ratio of the area of the second pixel electrode 212 to the area of a region in the power signal line 400 and the data signal line 500 that overlap the second pixel electrode 212, thereby better ensuring that color cast or dispersion does not exist in the display panel 10, and ensuring the display effect of the display panel 10. Herein, referring to FIGS. 8 and 9, the third pixel electrode 213 and the fourth pixel electrode 214 may be different pixel electrodes 210 in the display panel 10, that is, the third pixel electrode 213 and the fourth pixel electrode 214 are used for emitting light of different colors, or the third pixel electrode 213 and the fourth pixel electrode 214 are pixel electrodes 210 at different positions in the minimal repeating unit of the pixel arrangement. Further, as shown in FIG. 18, the third pixel electrode 213 and the fourth pixel electrode 214 may be the same pixel electrodes 210 in the display panel 10, that is, the third pixel electrode 213 and the fourth pixel electrode 214 are used for emitting light of the same color, or the third pixel electrode 213 and the fourth pixel electrode 214 are pixel electrodes 210 at the same position in the minimal repeating unit of the pixel arrangement. FIG. 18 merely shows that the pixel electrodes 210 are in the "π arrangement". That is, other pixel electrodes 210 are arranged in the same manner, and details are not repeated herein.

Figure 19:
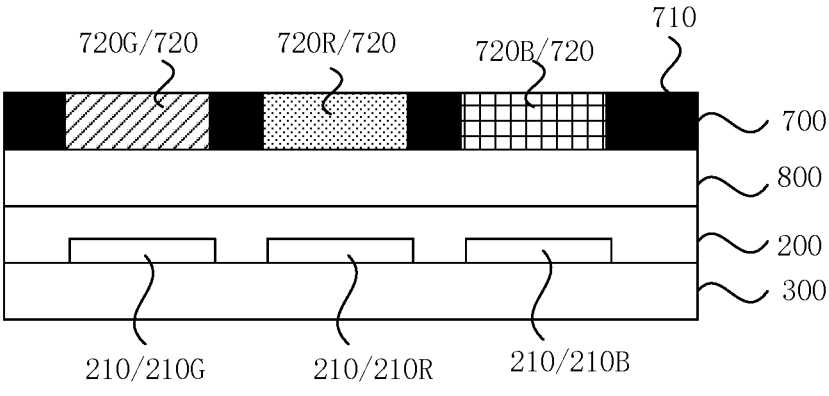
FIG. 19 is a sectional diagram of FIG. 1 taken along a sectional line A-A'.

FIG. 19 is a sectional diagram of FIG. 1 taken along a sectional line A-A'. Referring to FIGS. 1 and 19, the display panel 10 further includes a filter unit 700 located on one side of the light-emitting element 200 facing away from the pixel circuit 300. In the thickness direction of the display panel 10, the filter unit 700 at least partially overlaps the pixel electrode 210.

Specifically, referring to FIG. 19, the display panel 10 further includes a filter unit 700. In the thickness direction of the display panel 10, the filter unit 700 overlaps the pixel electrode 210. The light-emitting elements 200 include a light-emitting element emitting red light, a light-emitting element emitting green light, and a light-emitting element emitting blue light. The light-emitting elements emitting different colors correspond to different pixel electrodes 210, such as a red pixel electrode 210R, a blue pixel electrode 210B, and a green pixel electrode 210G. Further, the filter unit 700 may include a light shielding layer 710 and a color filter layer 720. The color filter layer 720 includes a red color filter layer 720R, a blue color filter layer 720B, and a green color filter layer 720G. There is a correspondence between the color filter layers 720 of different colors and the pixel electrodes 210 of different colors. Polarizers in the display panel 10 may also be replaced by the light shielding layer 710 and the color filter layer 720 so that on one hand, the reflection of ambient light can be reduced by the light shielding layer 400 and the color filter layer 610, the influence of the ambient light on the light output of the display panel 10 can be reduced, and the display effect of the display panel 10 can be improved. On the other hand, the light output efficiency of the display panel 10 can be improved by replacing the polarizers with the light shielding layer 710 and the color filter layer 720.

Further, in the display panel 10, one film unit 800 is disposed between the filter unit 700 and the light-emitting element 200. The film unit 800 may be used for preparing a touch control film, achieving the touch control and display effect of the display panel 10. Further, the film unit 800 may also be a thin film encapsulation layer, that is, the light-shielding layer 710 and the color filter layer 720 may be disposed on one side of the thin film encapsulation layer away from the light-emitting element 200 to achieve the display panel 10 in a "Color Filter On Touch (CFOT) technology" structure. This embodiment of the present disclosure is not limited based on the specific structure of the film unit 800.

Figure 20:
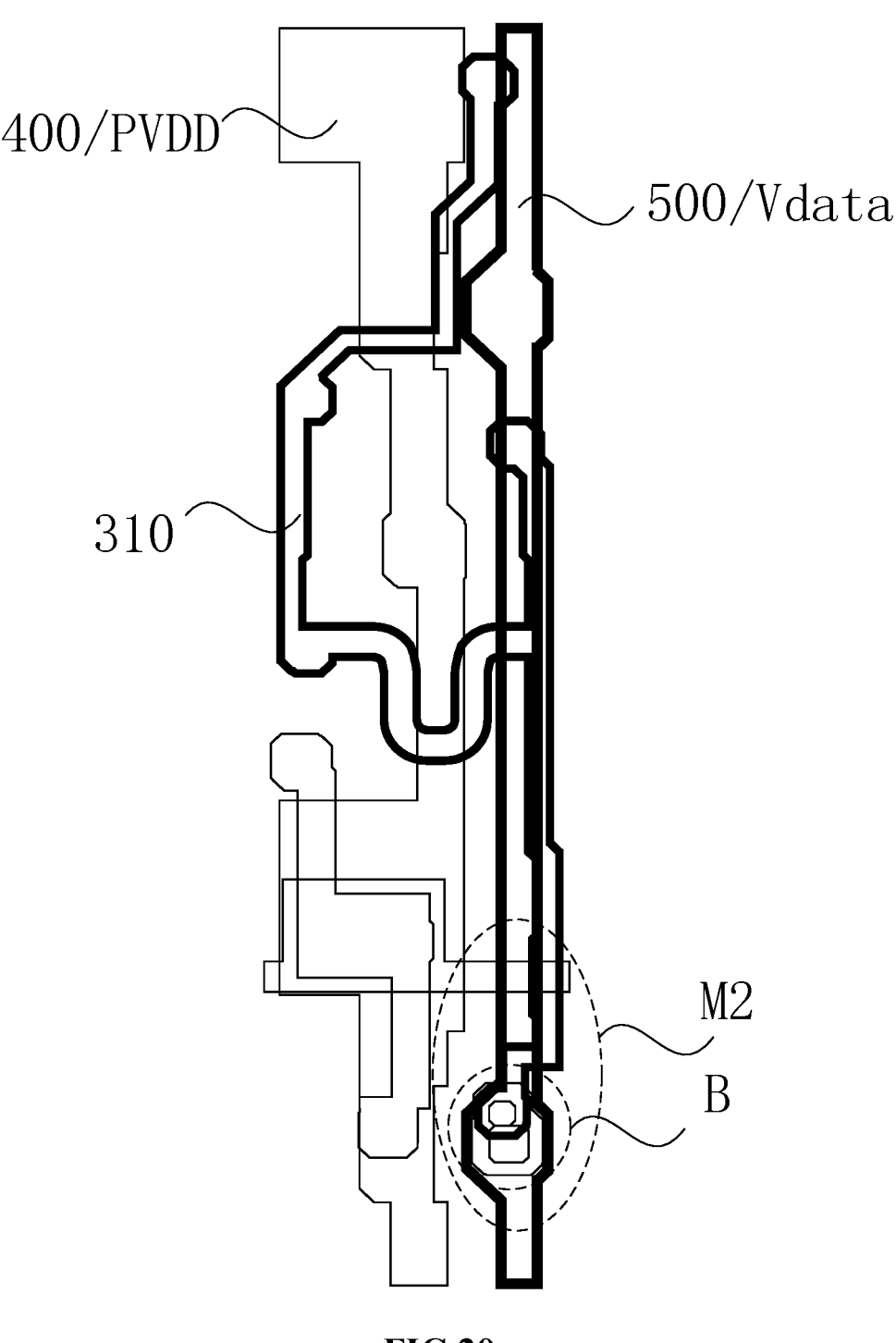
FIG. 20 is a schematic diagram of another portion of the structure of a pixel circuit in a display panel in FIG. 5.
Figure 21:
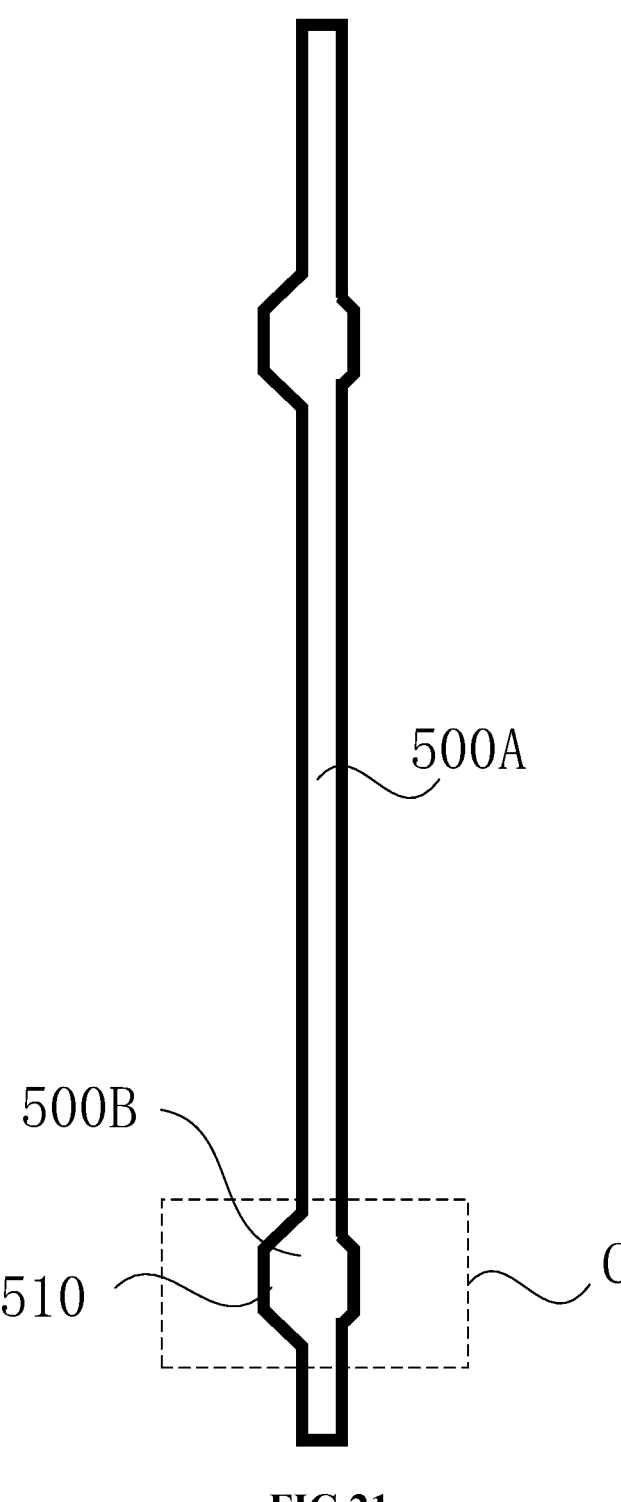
FIG. 21 is a schematic diagram of a portion of the structure of a pixel circuit in FIG. 20.
Figure 22:
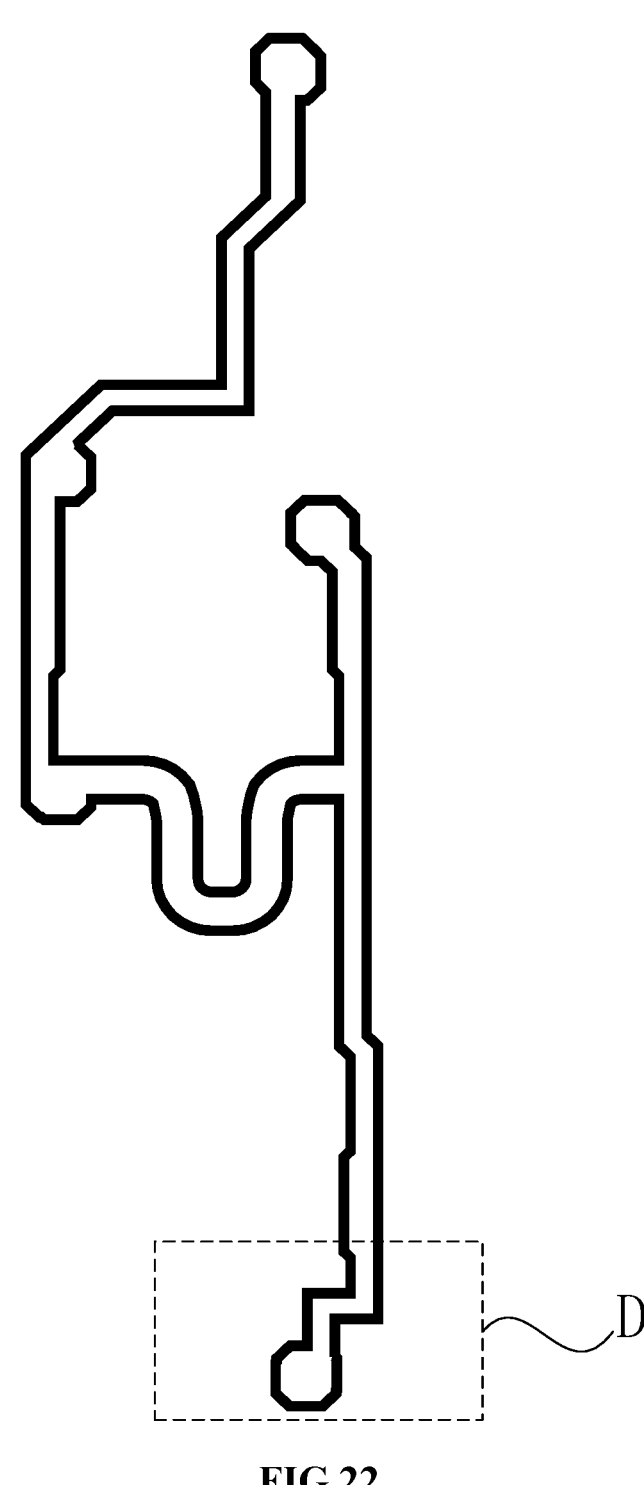
FIG. 22 is a structure diagram of another portion of the structure of a pixel circuit in FIG. 20.

FIG. 20 is a schematic diagram of another portion of the structure of a pixel circuit in FIG. 5. FIG. 21 is a schematic diagram of a portion of the structure of a pixel circuit in FIG. 20. FIG. 22 is a structure diagram of another portion of the structure of a pixel circuit in FIG. 20. Referring to FIGS. 20 to 22, the data signal line 500 in the display panel 10 includes a wiring portion 500A and a via connection portion 500B electrically connected to the wiring portion 500A. The pixel circuit 300 includes a data write transistor M2. The data signal line 500 is electrically connected to a first electrode of the data write transistor M2 through the via connection portion 500B. The first data wiring section 510 includes the via connection portion 500B.

As shown in FIG. 20, the pixel circuit 300 includes a data write transistor M2. A first electrode (shown in region B in FIG. 20) of the data write transistor M2 is electrically connected to the data signal line 500 to ensure that the data signal Vdata on the data signal line 500 is written in the pixel electrode 300 when the data write transistor M2 is turned on. It should be noted that the preceding is an example where the pixel electrodes 210 are in the "pyramid arrangement". The specific arrangement manner of the pixel electrodes 210 is not limited in the embodiments of the present disclosure.

Specifically, the data signal line 500 includes a wiring portion 500A and a via connection portion 500B. The wiring portion 500A is electrically connected to the via connection portion 500B. The wiring portion 500A is used for achieving the transmission of the data signal Vdata on the data signal line 500. The via connection portion 500B is used for achieving a via connection of the data signal line 500 to other films, i.e. achieving the transmission of the data signal Vdata to other films. As shown in FIG. 20, an input terminal, i.e. the first electrode, of the data write transistor M2 in the pixel circuit 300 is electrically connected to the data signal line 500 through the via connection portion 500B. That is, the data signal Vdata transmitted on the data signal line 500 is transmitted to the data write transistor M2 through the via connection portion 500B. That is, the data signal Vdata is transmitted to the pixel circuit 300.

Further, the position of the first data wiring section 510 is adjusted, that is, the first data wiring section 510 is moved closer to the side of the adjacent pixel electrode 210 to expose more spare space, thereby achieving the effect of increasing the light-transmitting region 10. It should be noted that the adjustment of the first data wiring section 510 has diversity, and this embodiment describes by using one adjustment manner in FIG. 22 as example. The first data wiring section 510 includes the via connection portion 500B, so the first electrode of the data write transistor M2 connected through the via connection portion 500B is adaptively adjusted while the position of the data signal line 500 is adjusted. It should be noted that the first electrode is adjusted by adjusting the active layer of the data write transistor M2. That is, the first active layer 310 is adjusted according to the adjustment manner of the first data wiring section 510. Exemplarily, as shown in FIG. 21, based on the arrangement position of the pixel electrodes overlapping the first data wiring sections 510, the first data wiring section 510 is adjusted as shown in region C in the FIG. 21. Meanwhile, referring to FIG. 22, the first active layer 310 is adaptively adjusted as shown in region D in the FIG. 22. The wiring is adjusted so that the overall light-transmitting effect of the display panel 10 is ensured.

Referring to FIGS. 20 to 22, in the thickness direction of the display panel 10, the first data wiring section 510 overlaps the first electrode of the data write transistor M2.

Specifically, an input terminal, i.e. a first electrode, of the transistor in the display panel 10, is usually disposed in a source layer or a drain layer of the transistor, and may also be defined at the position of the active layer of the transistor, i.e. a heavily doped position of the active layer.

Further, the first data wiring section 510 overlaps the first electrode of the data write transistor M2. That is, the via connection can be directly performed at the overlapping position of the first data wiring section 510 and the data write transistor M2. That is, the position of a via section is adjusted while adjusting the position of the corresponding data line in the transistor, i.e. adjusting the arrangement position of the active layer of the transistor. In other words, when the data line is adjusted, the corresponding structure is adaptively adjusted, ensuring the overall light-emitting performance.

Figure 23:
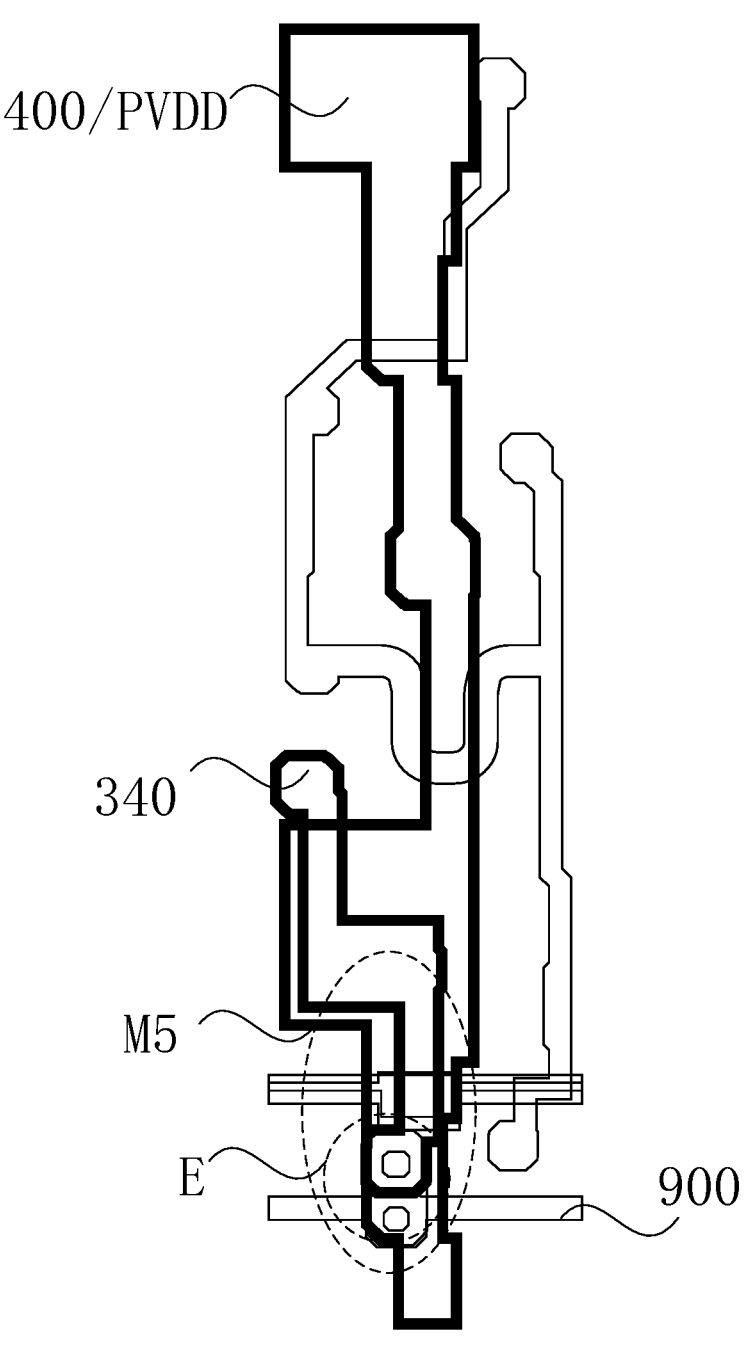
FIG. 23 is a schematic diagram of another portion of the structure of a pixel circuit in a display panel in FIG. 5.
Figure 24:
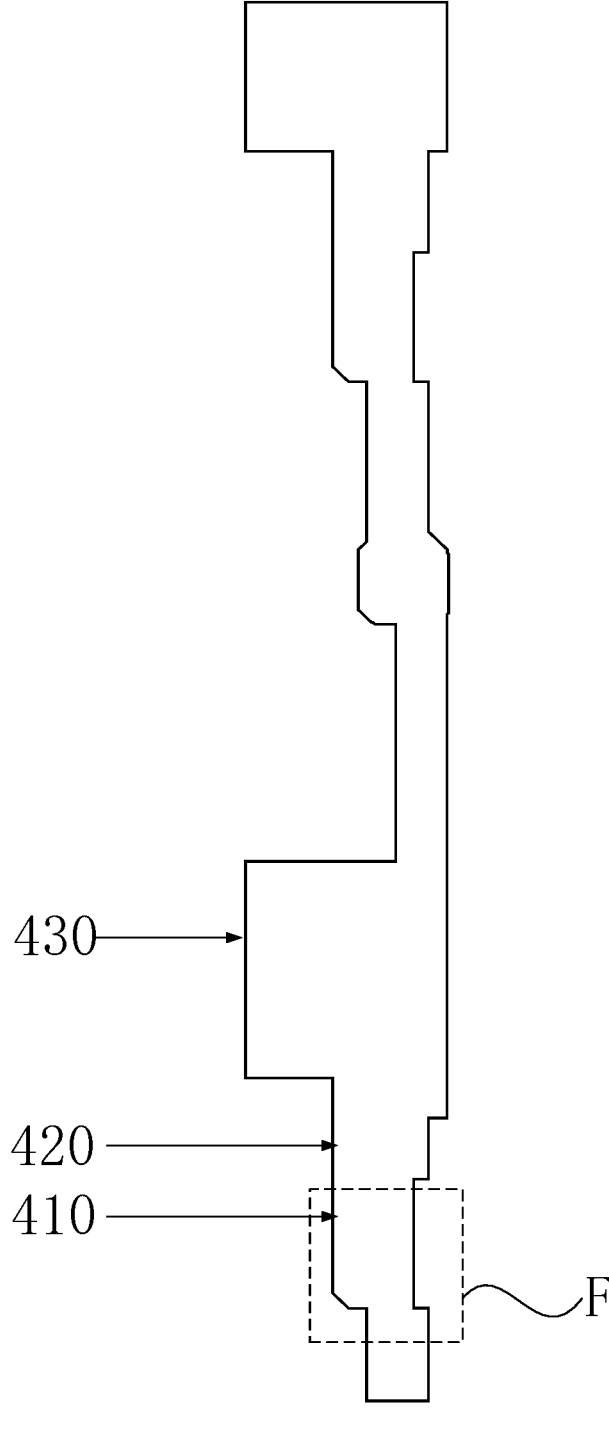
FIG. 24 is a structure diagram of a portion of the structure of a pixel circuit in FIG. 23.
Figure 25:
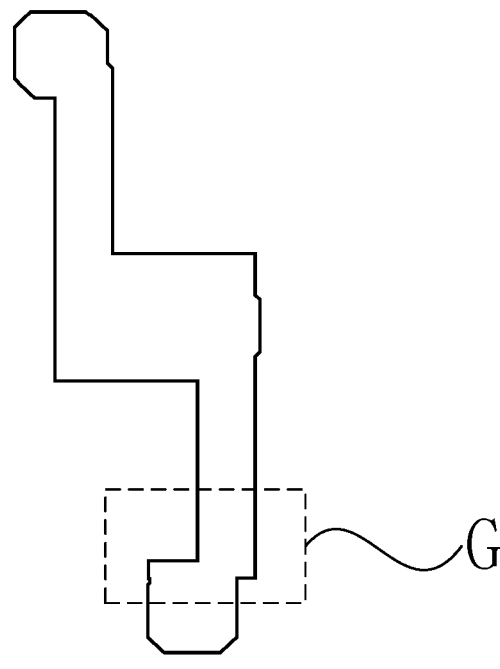
FIG. 25 is a structure diagram of another portion of the structure of a pixel circuit in FIG. 23.

FIG. 23 is a schematic diagram of another portion of the structure of a pixel circuit in FIG. 5. FIG. 24 is a structure diagram of a portion of the structure of a pixel circuit in FIG. 23. FIG. 25 is a structure diagram of another portion of the structure of a pixel circuit in FIG. 23. Referring to FIGS. 23 to 25, the pixel circuit 300 further includes an initialization transistor M5. A first electrode of the initialization transistor M5 is electrically connected to an initialization signal line 900. In the thickness direction of the display panel 10, the first power wiring section 410 overlaps the first electrode of the initialization transistor M5.

Referring to FIG. 23, the pixel circuit 300 includes the initialization transistor M5. The first electrode (shown in region E in FIG. 24) of the initialization transistor M5 is electrically connected to the initialization signal line 900 to ensure that the first reset signal Vref1 on the initialization signal line 900 is written to the pixel electrode 300 when the data write transistor M2 is turned on. It should be noted that the preceding is an example where the pixel electrodes 210 are in the "pyramid arrangement". The specific arrangement manner of the pixel electrodes 210 is not limited in the embodiments of the present disclosure.

Further, the position of the first power wiring section 410 is adjusted, that is, the first power wiring section 410 is moved closer to the side of the adjacent pixel electrode 210 to expose more spare space, thereby achieving the effect of increasing the light-transmitting region 10. It should be noted that the adjustment of the first power wiring section 410 has diversity, and this embodiment describes by using one adjustment manner in FIG. 23 as example. The first power wiring section 410 may overlap the first electrode of the initialization transistor M5. That is, the connection position between the initialization transistor M5 and the initialization signal line 900 is covered by the first power wiring section 410, thereby reducing the occupied space of the wiring in the display panel 10, and better ensuring the light-transmitting effect of the display panel 10. Exemplarily, the first reset signal Vref1 on the initialization signal line 900 is directly transmitted to the initialization transistor M5 through the second active layer 340. That is, referring to region F in FIG. 24 and region G in FIG. 25, when the position of the first power wiring section 410 is adjusted, the corresponding second active layer 340 is adaptively and cooperatively adjusted, thereby effectively ensuring the light transmittance of the display panel 10.

Figure 26:
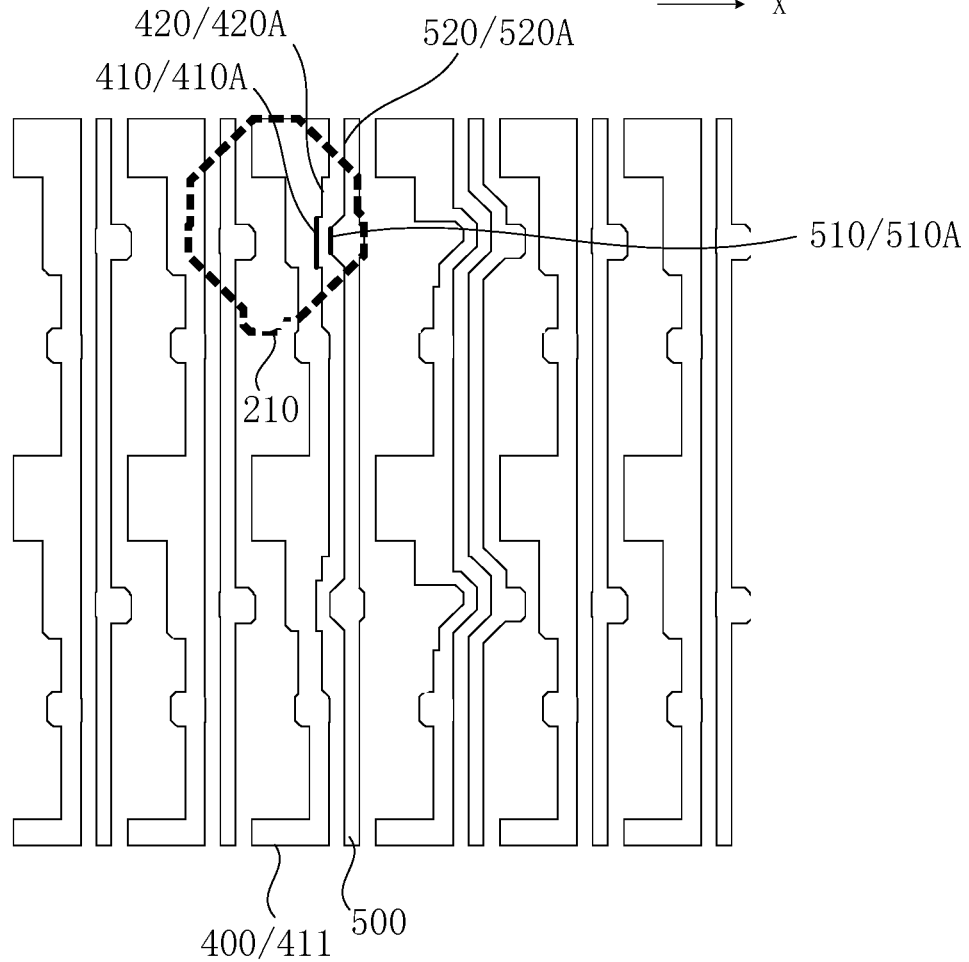
FIG. 26 is a schematic diagram of another portion of the structure of a pixel circuit in a display panel in FIG. 5.

FIG. 26 is a schematic diagram of another portion of the structure of a pixel circuit in FIG. 5. Referring to FIG. 26, the power signal line 400 further includes a second power wiring section 420 electrically connected to the first power wiring section 410. The multiple power signal lines 400 include first power signal lines 411. A first power signal line 411 includes the second power wiring section 420. In the first direction X, the second power wiring section 420 of the first power signal line 411 overlaps the second data wiring section 520. The second power wiring section 420 of the first power signal line 411 includes a second power boundary 420A adjacent to one side of the first data wiring section 510. The first power boundary 410A is located on one side of the second power boundary 420A facing away from the first data wiring section 510. The first data boundary 510A is located on one side of the second data boundary 520A adjacent to the first power wiring section 410. In the thickness direction of the display panel 10, the first power boundary 410A and the first data boundary 510A overlap a same pixel electrode 210.

As shown in FIG. 26, the multiple power signal lines 400 in the display panel 10 include the first power signal lines 411. The arrangement position of the first power signal lines 411 is adjusted, thereby ensuring that the first power signal lines 411 more overlap the adjacent pixel electrode 210. Since the region in which the pixel electrode 210 is located is an opaque region, the power signal line 400 also shields light due to the metal structure. Based on the preceding arrangement, the light-transmitting region of the display panel 10 can be relatively increased, thereby improving the light transmittance of the display panel 10.

Specifically, the first power signal line 411 includes the first power wiring section 410 and the second power wiring section 420. The first power wiring section 410 and the second power wiring section 420 are electrically connected. Further, the first power wiring section 410 includes the first power boundary 410A. The second power wiring section 420 includes the second power boundary 420A. The first data wiring section 510 of the data signal line 500 includes the first data boundary 510A. The second data wiring section 520 of the data signal line 500 includes the second data boundary 520A. It is to be noted that to clearly see the arrangement change of the wiring, the first power boundary 410A and the first data boundary 510A are bolded in FIG. 26. Referring to FIG. 26, the preceding wiring boundaries have a certain positional relationship. The second power boundary 420A is located on one side of the second power wiring section 420 closest to the first data wiring section 510. The first power boundary 410A is located on one side of the second power boundary 420A facing away from the same first data wiring section 510, that is, the second power boundary 420A is closer to the closest data signal line 500 than the first power boundary 410A. The first data boundary 510A is located on one side of the second data boundary 520A adjacent to the first power wiring section 410, that is, the first data boundary 510A is closer to the power signal line 400 than the second data boundary 520A. The first power wiring portion 410 is bent toward one side of the data signal line 500 close to the second power boundary 420A and the first power boundary 410A. The first power wiring portion 510 is bent toward one side of the power signal line 400 close to the first data wiring 510A.

Further, referring to FIG. 26, the figure shows only one pixel electrode 210 as example. Based on the specific number and arrangement position of pixel electrodes 210, no specific limitation is given. In the thickness direction of the display panel 10, the first power boundary 410A and the first data boundary 510A overlap the same pixel electrode 210. That is, the first power wiring section 410 in the power signal line 400, with respect to the second power wiring section 420, adjusts the position toward the side of the pixel electrode 210, and the first data wiring section 510 in the data signal line 500, with respect to the second data wiring section 510, adjusts the position toward the side of the pixel electrode 210. The first power wiring section 410 and the first data wiring section 510 are adjusted, thereby increasing an unshielded area in the display panel 10. That is, no light shielding layer, such as the area of the pixel electrode 210 and the metal wiring, is provided, thereby improving the overall light transmittance of the display panel 10.

Figure 27:
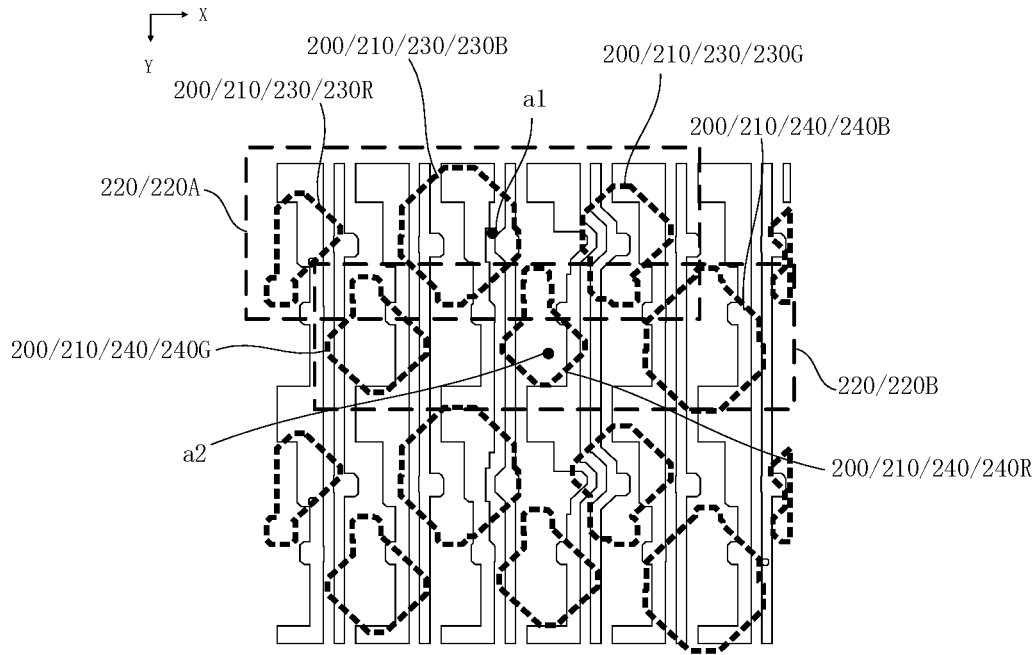
FIG. 27 is a schematic diagram of another portion of the structure of a pixel circuit in a display panel in FIG. 5.

FIG. 27 is a schematic diagram of another portion of the structure of a pixel circuit in FIG. 5. Referring to FIGS. 26 and 27, the display panel 10 includes multiple repetitive light-emitting element groups 220. The multiple repetitive light-emitting element groups 220 are arranged in an array. Each repetitive light-emitting element group 220 includes a first light-emitting element group 220A and a second light-emitting element group 220B. The first light-emitting element group 220A includes multiple first light-emitting elements 230. The second light-emitting element group 220B includes multiple second light-emitting elements 240. In the first direction X, the first light-emitting elements 230 and the second light-emitting elements 240 are sequentially and alternately arranged. In the second direction Y, the center a1 of the first light-emitting element 230 is staggered from the center a2 of the second light-emitting element 240. The first light-emitting element group 220A includes a red light-emitting element 230R, a blue light-emitting element 230B, and a green light-emitting element 230G sequentially arranged in the first direction X. The second light-emitting element group 220B includes a green light-emitting element 240G, a red light-emitting element 240R, and a blue light-emitting element 240B sequentially arranged in the first direction X. In the thickness direction of the display panel 10, both the first power boundary 410A and the first data boundary 510A overlap a pixel electrode 210 of the blue light-emitting element 230B.

Specifically, referring to FIG. 27, the repetitive light-emitting element group 220 includes the first light-emitting element group 220A and the second light-emitting element group 220B. The first light-emitting element group 220A includes multiple first light-emitting elements 230. The second light-emitting element group 220B includes multiple second light-emitting elements 240. The repetitive light-emitting element group 220 is the minimum unit having repeatability in the row or column direction among the multiple first light-emitting elements 230 and the multiple second light-emitting elements 240 arranged in the display area 100.

Further, referring to FIG. 27, the first light-emitting element group 220A includes the red light-emitting element 230R, the blue light-emitting element 230B, and the green light-emitting element 230G sequentially arrange in the first direction X. The second light-emitting element group 220B includes the green light-emitting element 240G, the red light-emitting element 240R, and the blue light-emitting element 240B sequentially arrange in the first direction X. The light-emitting elements 200 constitute the repetitive unit group 220. Further, referring to FIG. 26, the first power boundary 410A and the first data boundary 510A are adjusted to overlap the pixel electrode 210 of the blue light-emitting element 230B in the repetitive unit group 220, i.e. reflecting an adjustment manner in which the first power wiring section 410 and the first data wiring section 510 are shifted toward one side of the pixel electrode 210 of the blue light-emitting element 230B, thereby increasing the light-transmitting region of the display panel 10.

Figure 28:
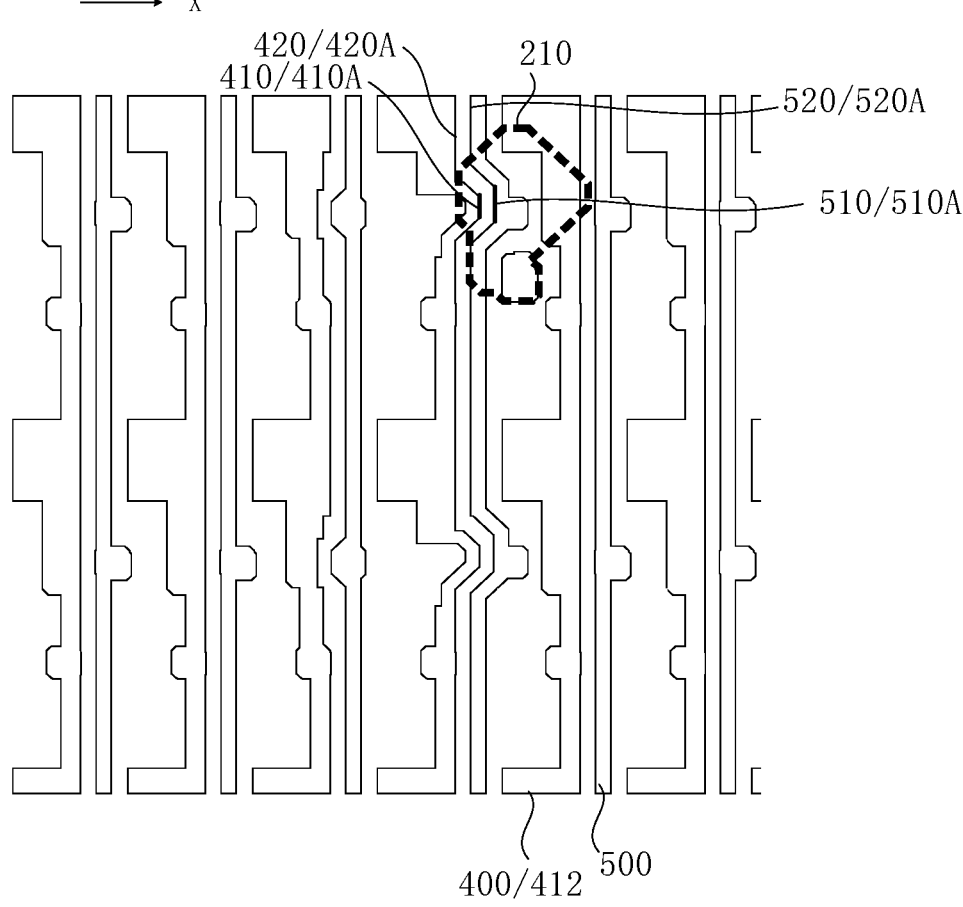
FIG. 28 is a schematic diagram of another portion of the structure of a pixel circuit in a display panel in FIG. 5.

FIG. 28 is a schematic diagram of another portion of the structure of a pixel circuit in FIG. 5. Referring to FIG. 28, the power signal line 400 further includes a second power wiring section 420 electrically connected to the first power wiring section 410. The multiple power signal lines 400 include second power signal lines 412. A second power signal line 412 includes the second power wiring section 420. In the first direction X, the second power wiring section 420 of the second power signal line 412 overlaps the second data wiring section 520. The second power wiring section 420 of the second power signal line 412 includes a second power boundary 420A adjacent to one side of the first data wiring section 510. The first power boundary 410A is located at one side of the second power boundary 420A adjacent to the first data wiring section 510. The first data boundary 510A is located on one side of the second data boundary 520A facing away from the first power wiring section 410. In the thickness direction of the display panel 10, the first power boundary 410A and the first data boundary 510A overlap a same pixel electrode 210.

Referring to FIG. 28, the multiple power signal lines 400 in the display panel 10 include the second power signal lines 412. The arrangement position of the second power signal lines 412 is adjusted, thereby ensuring that the second power signal lines 412 more overlap the adjacent pixel electrode 210. Since the region in which the pixel electrode 210 is located is an opaque region, the power signal line 400 also shields light due to the metal structure. Based on the preceding arrangement, the light-transmitting region of the display panel 10 can be relatively increased, thereby improving the light transmittance of the display panel 10.

Specifically, the second power signal line 412 includes the first power wiring section 410 and the second power wiring section 420. The first power wiring section 410 and the second power wiring section 420 are electrically connected. Further, the first power wiring section 410 includes the first power boundary 410A. The second power wiring section 420 includes the second power boundary 420A. Meanwhile, the first data wiring section 510 of the data signal line 500 includes the first data boundary 510A. The second data wiring section 520 of the data signal line 500 includes the second data boundary 520A. It is to be noted that to clearly see the arrangement change of the wiring, the first power boundary 410A and the first data boundary 510A are bolded in FIG. 28. Referring to FIG. 28, the preceding wiring boundaries have a certain positional relationship. The second power boundary 420A is located on one side of the second power wiring section 420 adjacent to the first data wiring section 510. The first power boundary 410A is located on one side of the second power boundary 420A adjacent to the first data wiring section 510. That is, the second power boundary 420A is farther from the data signal line 500 than the first power boundary 410A, which means that the second power signal line 412 is bent at the first power boundary 410A of the first power wiring section 410 in a direction closer to the data signal line 500. Meanwhile, in the first direction X, the first data boundary 510A is located on one side of the second data boundary 520A adjacent to the first power wiring section 410. That is, the first data wiring section 510 has the same bending tendency as the first power wiring section 410. That is, the first data wiring section 510 and the first power wiring section 410 is bent toward the adjacent pixel electrode 210, thereby ensuring more space to be reserved on one side of the first power wiring section 410 away from the first data wiring section 510. The space does not overlap the pixel electrode 210, thereby ensuring the overall light-transmitting effect of the display panel 10.

Further, referring to FIG. 28, the figure shows only one pixel electrode 210 as example. Based on the specific number and arrangement position of pixel electrodes 210, no specific limitation is given. In the thickness direction of the display panel 10, the first power boundary 410A and the first data boundary 510A overlap the same pixel electrode 210. That is, the first power wiring section 410 in the power signal line 400, with respect to the second power wiring section 420, adjusts the position toward the side of the pixel electrode 210. The first data wiring section 510 in the data signal line 500, with respect to the second data wiring section 520, adjusts the position toward the side of the pixel electrode 210. The first power wiring section 410 and the first data wiring section 510 are adjusted, increasing an unshielded area in the display panel 10. That is, no light shielding layer, such as the area of the pixel electrode 210 and the metal wiring, is provided, thereby improving the overall light transmittance of the display panel 10.

Referring to FIGS. 27 and 28, the display panel 10 includes multiple repetitive light-emitting element groups 220. The multiple repetitive light-emitting element groups 220 are arranged in an array. Each repetitive light-emitting element group 220 includes a first light-emitting element group 220A and a second light-emitting element group 220B. The first light-emitting element group 220A includes multiple first light-emitting elements 230. The second light-emitting element group 220B includes multiple second light-emitting elements 240. In the first direction X, the first light-emitting elements 230 and the second light-emitting elements 240 are sequentially and alternately arranged. In the second direction Y, the center a1 of the first light-emitting element 230 is staggered from the center a2 of the second light-emitting element 240. The first light-emitting element group 220A includes a red light-emitting element 230R, a blue light-emitting element 230B, and a green light-emitting element 230G sequentially arranged in the first direction X. The second light-emitting element group 220B includes a green light-emitting element 240G, a red light-emitting element 240R, and a blue light-emitting element 240B sequentially arranged in the first direction X. In the thickness direction of the display panel 10, both the first power boundary 410A and the first data boundary 510A overlap a pixel electrode 210 of the green light-emitting element 230G.

Further, referring to FIG. 27, the first light-emitting element group 220A includes the red light-emitting element 230R, the blue light-emitting element 230B, and the green light-emitting element 230G sequentially arrange in the first direction X. The second light-emitting element group 220B includes the green light-emitting element 240G, the red light-emitting element 240R, and the blue light-emitting element 240B sequentially arrange in the first direction X. The light-emitting elements 200 constitute the repetitive unit group 220. Further, referring to FIG. 26, the first power boundary 410A and the first data boundary 510A are adjusted to overlap the pixel electrode 210 of the green light-emitting element 230G in the repetitive unit group 220, i.e. reflecting an adjustment manner in which the first power wiring section 410 and the first data wiring section 510 are shifted toward one side of the pixel electrode 210 of the green light-emitting element 230G, thereby increasing the light-transmitting region of the display panel 10.

Figure 29:
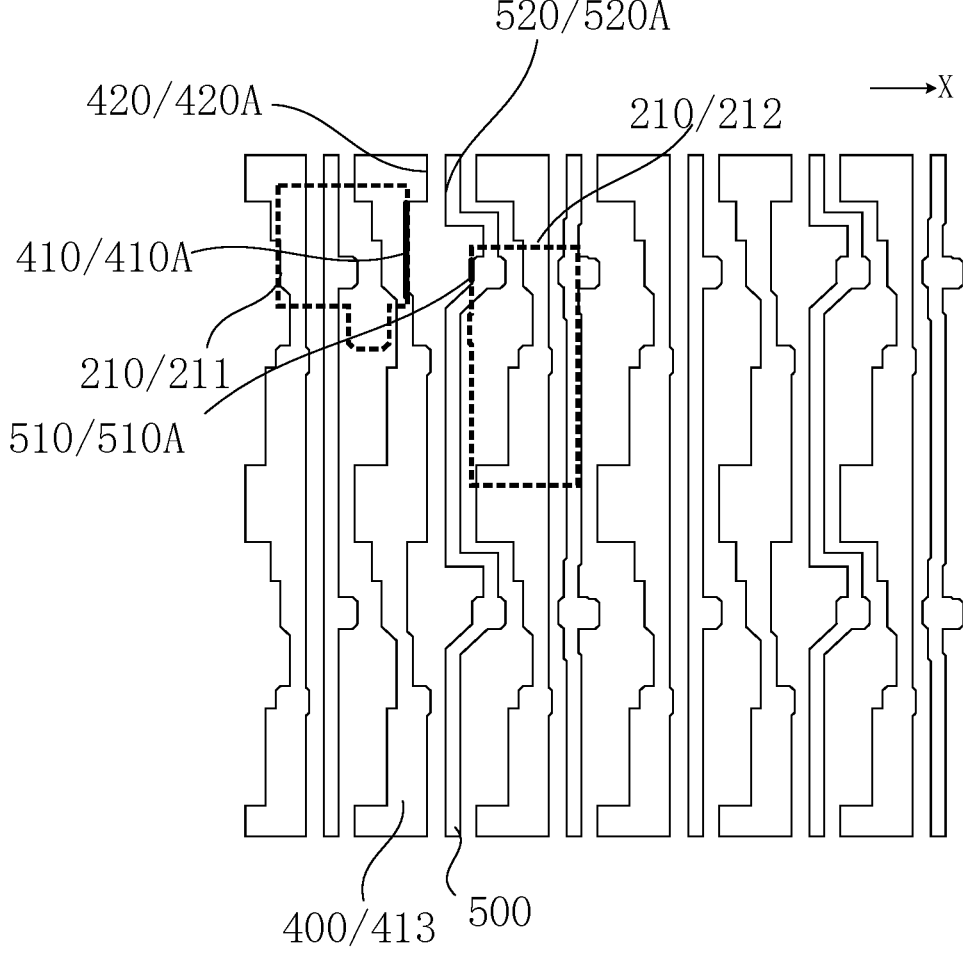
FIG. 29 is a schematic diagram of another portion of the structure of a pixel circuit in a display panel in FIG. 8.

FIG. 29 is a schematic diagram of another portion of the structure of a pixel circuit in FIG. 8. Referring to FIG. 29, the power signal line 400 includes a second power wiring section 420 electrically connected to the first power wiring section 410. The multiple power signal lines 400 include third power signal lines 413. A third power signal line 413 includes the second power wiring section 420. In the first direction X, the second power wiring section 420 of the third power signal line 413 overlaps the second data wiring section 520. The second power wiring 420 of the third power signal line 413 includes a second power boundary 420A adjacent to one side of the first data wiring section 510. The first power boundary 410A is located on one side of the second power boundary 420A facing away from the first data wiring section 510. The first data boundary 510A is located on one side of the second data boundary 520A facing away from the first power wiring section 410. In the thickness direction of the display panel 10, the first power boundary 410A overlaps the first pixel electrode 211, and the first data boundary 510A overlaps the second pixel electrode 212.

As shown in FIG. 29, the multiple power signal lines 400 in the display panel 10 include the third power signal lines 413. The arrangement position of the third power signal lines 413 is adjusted, thereby ensuring that the third power signal lines 413 more overlap the adjacent pixel electrode 210. Since the region in which the pixel electrode 210 is located is an opaque region, the power signal line 400 also shields light due to the metal structure. Based on the preceding arrangement, the light-transmitting region of the display panel 10 can be relatively increased, thereby improving the light transmittance of the display panel 10.

Specifically, the third power signal line 413 includes the first power wiring section 410 and the second power wiring section 420. The first power wiring section 410 and the second power wiring section 420 are electrically connected. Further, the first power wiring section 410 includes the first power boundary 410A. The second power wiring section 420 includes the second power boundary 420A. The first data wiring section 510 of the data signal line 500 includes the first data boundary 510A. The second data wiring section 520 of the data signal line 500 includes the second data boundary 520A. It is to be noted that to clearly see the arrangement change of the wiring, the first power boundary 410A and the first data boundary 510A are bolded in FIG. 28.

Referring to FIG. 29, the preceding wiring boundaries have a certain positional relationship. The second power boundary 420A is located on one side of the second power wiring section 420 adjacent to the first data wiring section 510. The first power boundary 410A is located on one side of the second power boundary 420A facing away from the same first data wiring section 510. That is, the second power boundary 420A is closer to the data signal line 500 than the first power boundary 410A. That is, the first power wiring section 410 moves away from one side of the adjacent data signal line 500 to spare part of space not overlapping the pixel electrode 210, thereby increasing the light-transmitting region of the display panel 10. The first data boundary 510A is located on one side of the second data boundary 520A facing away from the first power wiring section 410 of the third power signal line 413. That is, the first data boundary 510A is farther from the third power signal line 413 than the second data boundary 520A. The first data wiring section 510 is bent toward one side away from the third power signal line 413 to spare part of space not overlapping the pixel electrode 210, thereby increasing the light-transmitting region of the display panel 10.

Further, referring to FIG. 29, the figure shows only two pixel electrodes 210 as example. Based on the specific number and arrangement position of pixel electrodes 210, no specific limitation is given. In the thickness direction of the display panel 10, the first power boundary 410A overlaps the first pixel electrode 211. The first data boundary 510A overlaps the second pixel electrode 212. That is, the first power wiring section 410 in the power signal line 400, with respect to the second power wiring section 420, adjusts the position toward the side of the one pixel electrode 210 in the adjacent pixel electrodes 210. The first data wiring section 510 in the data signal line 500, with respect to the second data wiring section 520, adjusts the position toward the side of the other pixel electrode 210 in the adjacent pixel electrodes 210. The first power wiring section 410 and the first data wiring section 510 are adjusted, thereby increasing an unshielded area in the display panel 10. That is, no light shielding layer, such as the area of the pixel electrode 210 and the metal wiring, is provided, thereby improving the overall light transmittance of the display panel 10.

Figure 30:
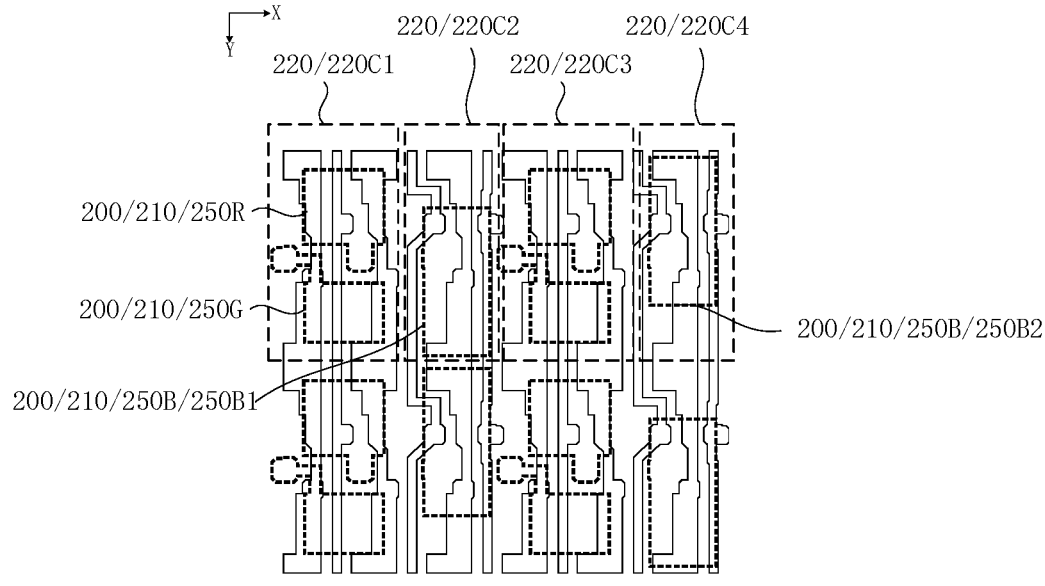
FIG. 30 is a schematic diagram of another portion of the structure of a pixel circuit in a display panel in FIG. 8.

FIG. 30 is a schematic diagram of another portion of the structure of a pixel circuit in FIG. 8. Referring to FIGS. 29 and 30, the display panel 10 includes multiple repetitive light-emitting element groups 220. The multiple repetitive light-emitting element groups 220 are arranged in an array. Each repetitive light-emitting element group 220 includes a first light-emitting element column 220C1, a second light-emitting element column 220C2, a third light-emitting element column 220C3, and a fourth light-emitting element column 220C4 arranged in the first direction X. The first light-emitting element column 220C1 and the third light-emitting element column 220C3 are arranged in the same manner and each of the first light-emitting element column 220C1 and the third light-emitting element column 220C3 includes one red light-emitting element 250R and one green light-emitting element 250G arranged in the second direction Y Each of the second light-emitting element column 220C2 and the fourth light-emitting element column 220C4 includes one blue light-emitting element 250B. A blue light-emitting element 250B1 in the second light-emitting element column 220C2 and a blue light-emitting element 250B2 of the fourth light-emitting element column 220C4 are staggered in the first direction X. In the thickness direction of the display panel 10, the first power boundary 410A overlaps a pixel electrode 210 of the green light-emitting element 250G, and the first data boundary 510B overlaps a pixel electrode 210 of the blue light-emitting element 250B.

Specifically, referring to FIG. 30, the repetitive light-emitting element group 220 includes the first light-emitting element column 220C1, the second light-emitting element column 220C2, the third light-emitting element column 220C3, and the fourth light-emitting element column 220C4. The first light-emitting element column 220C1, the second light-emitting element column 220C2, the third light-emitting element column 220C3, and the fourth light-emitting element column 220C4 include light-emitting elements 200 of different colors. The repetitive light-emitting element group 220 is the minimum unit having repeatability in the row or column direction among the multiple light-emitting elements of different colors arranged in the display area 100.

Further, referring to FIG. 30, each of the first light-emitting element column 220C1 and the third light-emitting element column 220C3 includes one red light-emitting element 250R and one green light-emitting element 250G arranged in the second direction Y. Each of the second light-emitting element column 220C2 and the fourth light-emitting element column 220C4 includes one blue light-emitting element 250B. All of the preceding light-emitting elements constitute one repetitive light-emitting element group 220. It is to be noted that blue light-emitting elements 250B included in the second light-emitting element column 220C2 and the fourth light-emitting element column 220C4 are staggered in the first direction X.

Further, referring to FIG. 30, the positions of the first power boundary 410A and the first data boundary 510A are adjusted to increase the overlapping areas of the power signal lines 400 and the pixel electrodes 210 and the overlapping areas of the data signal lines 500 and the pixel electrodes 210 as much as possible, thereby reserving more space to achieve the light-transmitting performance of the display panel 10. Specifically, the first power boundary 410A overlaps the pixel electrode 210 of the green light-emitting element 250G. That is, the first power boundary 410A is bent toward the pixel electrode 210 of the adjacent green light-emitting element 250G. The first data boundary 510B is bent toward the pixel electrode 210 of the adjacent blue light-emitting element 250B, i.e. reflecting an adjustment manner in which the first power wiring section 410 and the first data wiring section 510 are shifted toward one side of the pixel electrode 210 of the blue light-emitting element 230B, thereby increasing the light-transmitting region of the display panel 10.

Figure 31:
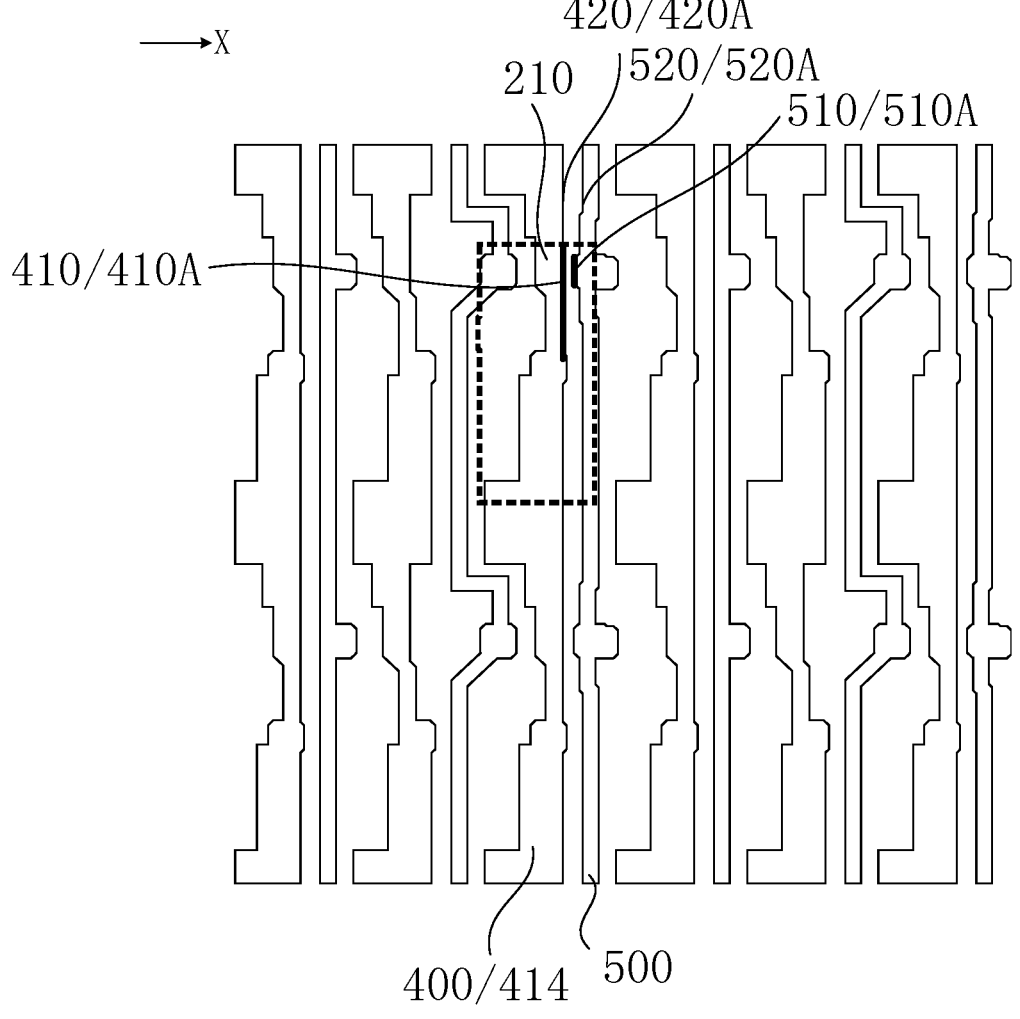
FIG. 31 is a schematic diagram of another portion of the structure of a pixel circuit in a display panel in FIG. 8.

FIG. 31 is a schematic diagram of another portion of the structure of a pixel circuit in FIG. 8. Referring to FIG. 31, the power signal line 400 further includes a second power wiring section 420 electrically connected to the first power wiring section 410. The multiple power signal lines 400 include fourth power signal lines 414. A fourth power signal line 414 includes the second power wiring section 420. In the first direction X, the second power wiring section 420 of the fourth power signal line 414 overlaps the second data wiring section 520. The second power wiring section 420 of the fourth power signal line 414 includes a second power boundary 420A adjacent to one side of the first data wiring section 510. The first power boundary 410A coincides with an extension line of the second power boundary 420A. The first data boundary 510A is located on one side of the second data boundary 520A adjacent to the first power wiring section 410. In the thickness direction of the display panel 10, the first data boundary 410A and the first data boundary 510A overlap the same pixel electrode 210.

Referring to FIG. 31, the multiple power signal lines 400 in the display panel 10 include the fourth power signal lines

414. The arrangement position of the fourth power signal lines 414 is adjusted, thereby ensuring that the fourth power signal lines 414 more overlap the adjacent pixel electrode 210. Since the region in which the pixel electrode 210 is located is an opaque region, the power signal line 400 also shields light due to the metal structure. Based on the preceding arrangement, the light-transmitting region of the display panel 10 can be relatively increased, thereby improving the light transmittance of the display panel 10.

Specifically, the fourth power signal lines 414 includes the first power wiring section 410 and the second power wiring section 420. The first power wiring section 410 and the second power wiring section 420 are electrically connected. Further, the first power wiring section 410 includes the first power boundary 410A. The second power wiring section 420 includes the second power boundary 420A. Meanwhile, the first data wiring section 510 of the data signal line 500 includes the first data boundary 510A. The second data wiring section 520 of the data signal line 500 includes the second data boundary 520A. It is to be noted that to clearly see the arrangement change of the wiring, the first power boundary 410A and the first data boundary 510A are bolded in FIG. 31. Referring to FIG. 31, the preceding wiring boundaries have a certain positional relationship. The second power boundary 420A is located on one side of the second power wiring section 420 adjacent to the data signal line 500. The first power boundary 410A is located on one side of the first power wiring section 410 adjacent to the data signal line 500. The first power boundary 410A coincides with the extension line of the second power boundary 420A, that is, the first power wiring section 410 of the fourth power signal line 414 is bent toward one side of the data signal line 500 adjacent to the first power boundary 410A, and is bent to the second power boundary 420A. The first data boundary 510A is located on one side of the second data boundary 520A adjacent to the fourth power signal line 414 of the first power wiring section 410, that is, the first data boundary 510A is closer to the fourth power signal line 414 than the second data boundary 520A. The first data wiring section 510 is bent toward one side close to the fourth power signal line 414 to spare part of space not overlapping the pixel electrode 210, thereby increasing the light-transmitting region of the display panel 10.

Further, referring to FIG. 31, the figure shows only one pixel electrode 210 as example. Based on the specific number and arrangement position of pixel electrodes 210, no specific limitation is given. In the thickness direction of the display panel 10, the first power boundary 410A overlaps the pixel electrode 210, and meanwhile, the first data boundary 510A overlaps the pixel electrode 210. That is, part of the wirings in the power signal line 400 of the data signal line 500 are adjusted, increasing an unshielded area in the display panel 10. That is, no light shielding layer, such as the area of the pixel electrode 210 and the metal wiring, is provided, improving the overall light transmittance of the display panel 10.

Referring to FIGS. 30 and 31, the display panel 10 includes multiple repetitive light-emitting element groups 220. The multiple repetitive light-emitting element groups 220 are arranged in an array. Each repetitive light-emitting element group 220 includes a first light-emitting element column 220C1, a second light-emitting element column 220C2, a third light-emitting element column 220C3, and a fourth light-emitting element column 220C4 arranged in the first direction X. The first light-emitting element column 220C1 and the third light-emitting element column 220C3 are arranged in the same manner and each of the first light-emitting element column 220C1 and the third light-emitting element column 220C3 includes one red light-emitting element 250R and one green light-emitting element 250G arranged in the second direction Y Each of the second light-emitting element column 220C2 and the fourth light-emitting element column 220C4 includes one blue light-emitting element 250B. The blue light-emitting elements 250B1 of the second light-emitting element column 220C2 and the blue light-emitting elements 250B2 in the fourth light-emitting element column 220C4 are staggered in the first direction X. In the thickness direction of the display panel 10, the first power boundary 410A overlaps the pixel electrode 210 of the blue light-emitting element 250B, and the first data boundary 510A overlaps a pixel electrode 210 of the blue light-emitting element 250B.

Further, referring to FIGS. 30 and 31, the positions of the first power boundary 410A and the first data boundary 510A are adjusted to increase the overlapping areas of the power signal lines 400 and the pixel electrodes 210 and the overlapping areas of the data signal lines 500 and the pixel electrodes 210 as much as possible, thereby reserving more space to achieve the light-transmitting performance of the display panel 10.

Specifically, the first power boundary 410A overlaps the pixel electrode 210 of the blue light-emitting element 250B, that is, the first power boundary 410A is bent toward the pixel electrode 210 of the adjacent blue light-emitting element 250B. The first data boundary 510A overlaps the pixel electrode 210 of the blue light-emitting element 250B, that is, the first data boundary 510B is bent toward the pixel electrode 210 of the adjacent blue light-emitting element 250B, i.e. reflecting an adjustment manner in which the first power wiring portion 410 and the first data wiring portion 510 are shifted toward one side of the pixel electrode 210 of the blue light-emitting element 230B, thereby increasing the light-transmitting region of the display panel 10.

As shown in FIGS. 3, 23, and 24, in the thickness direction of the display panel 10, the second power wiring section 420 overlaps a gate of the initialization transistor M5. Moreover, the line width of the second power wiring section 420 is larger than or equal to the line width of the first power wiring section 410.

Specifically, the power signal line 400 may include the first power wiring section 410 and the second power wiring section 420. Referring to FIGS. 23 and 24, in the thickness direction of the display panel 10, the first power wiring section 410 overlaps the first electrode of the initialization transistor M5, and the second power wiring section 420 overlaps the gate of the initialization transistor M5. The size of the power signal line 400 at different positions is adjusted to ensure that the power signal line 400 better covers the whole initialization transistor M5, thereby facilitating the overall flatness performance of the display panel 10. Based on the size of the gate of the initialization transistor M5 in the first direction X being larger than the size of the first electrode of the initialization transistor M5 in the first direction X, the sizes of the first power wiring portion 410 and the second power wiring portion 420 in the first direction X are adaptively adjusted so that the line width of the second power wiring portion 420 can be larger than the line width of the first power wiring portion 410, or the line width of the second power wiring portion 420 can be equal to the line width of the first power wiring portion 410, better ensuring the overall display effect of the display panel 10.

Referring to FIGS. 1, 3, and 24, the pixel circuit 300 further includes the driving transistor M3. The pixel circuit 300 further includes the first capacitor C1 connected in series between a gate of the data write transistor M2 and a gate of the driving transistor M3. The power signal line 400 further includes a third power wiring section 430 overlapping the first capacitor C1. In the first direction X, the line width of the third power wiring section 430 is larger than the line width of the second power wiring section 420.

Further, referring to FIGS. 1 and 3, the pixel circuit 300 includes the first capacitor C1 and the driving transistor M3. The first capacitor C1 is disposed in series between the gate of the data write transistor M2 and the gate of the driving transistor M3, and the first capacitor C1, the gate of the data write transistor M2, and the gate of the driving transistor M3 are connected to a first node N1.

Specifically, the power signal line 400 may include the first power wiring portion 410, the second power wiring portion 420, and the third power wiring portion 430. Referring to FIGS. 3 and 24, in the thickness direction of the display panel 10, the first power wiring portion 410 overlaps the first electrode of the initialization transistor M5, while the second power wiring portion 420 overlaps the gate of the initialization transistor M5, and the third power wiring portion 430 overlaps the first capacitor C1. The size of the power signal line 400 at different locations is adjusted, thereby facilitating achieving the overall flatness performance of the display panel 10. Considering the covering and overlapping of the third power wiring 430 and the first capacitor C1, on the basis that the line width of the second power wiring section 420 is larger than or equal to the line width of the first power wiring section 410, the line width of the third power wiring section 430 is adjusted to be larger than the line width of the second power wiring section 420, thereby better ensuring the overall operation effect of the display panel 10.

Figure 32:
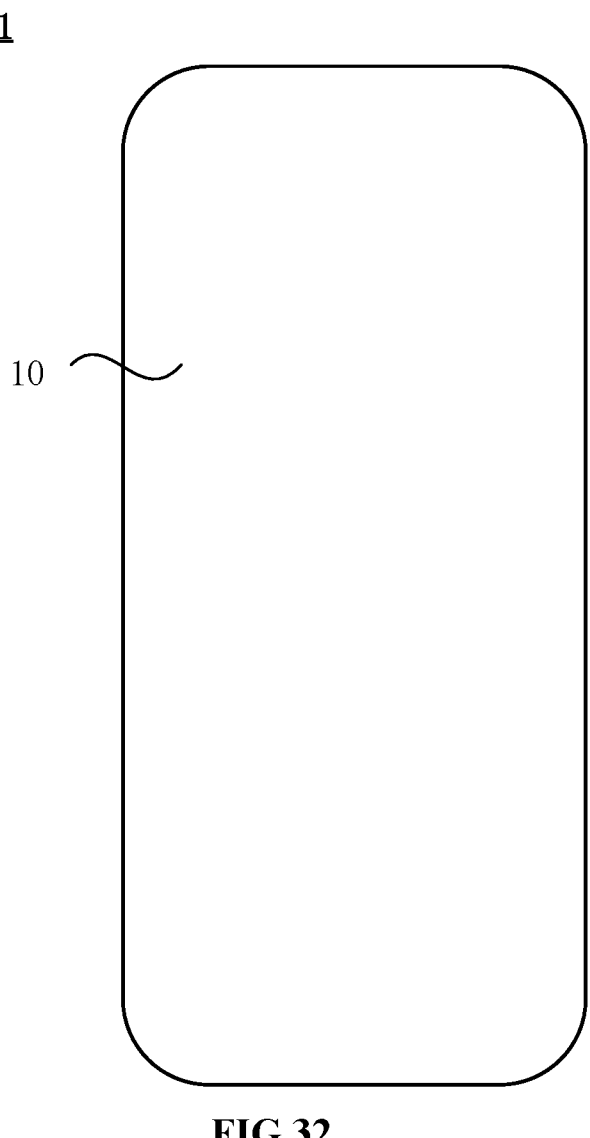
FIG. 32 is a structure diagram of a display device according to an embodiment of the present disclosure.

Based on the same inventive concept, an embodiment of the present disclosure further provides a display device. FIG. 32 is a structure diagram of a display device according to an embodiment of the present disclosure. As shown in FIG. 32, the display device 1 includes the display panel 10 according to any one of the preceding embodiments. Therefore, the display device 1 provided in the embodiment of the present disclosure has the corresponding beneficial effects in the preceding embodiments, and details are not repeated herein. Exemplarily, the display device 1 may be an electronic device such as a mobile phone, a computer, a smart wearable device (for example, a smart watch), or an in-vehicle display device, and this embodiment of the present disclosure is not limited thereto.

It is to be noted that the preceding are preferred embodiments of the present disclosure and the technical principles used therein. It will be understood by those skilled in the art that the present disclosure is not limited to the specific embodiments described herein. Those skilled in the art can make various apparent changes, modifications and substitutions without departing from the scope of the present disclosure. Therefore, while the present disclosure has been described in detail through the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising: a display region comprising a plurality of light-emitting elements and a plurality of pixel circuits, wherein the plurality of light-emitting elements are electrically connected to the plurality of pixel circuits, respectively; and the display panel further comprising a plurality of power signal lines and a plurality of data signal lines located in the display region, wherein the plurality of power signal lines are electrically connected to the plurality of pixel circuits, the plurality of data signal lines are electrically connected to the plurality of pixel circuits, and the plurality of power signal lines and the plurality of data signal lines are disposed in a same layer;

a light-emitting element of the plurality of light-emitting elements comprises a pixel electrode, a power signal line of at least part of the power signal lines comprises a first power wiring section, and a data signal line of at least part of the data signal lines comprises a first data wiring section and a second data wiring section electrically connected to the first data wiring section; the first power wiring section comprises a first power boundary adjacent to one side of the first data wiring section, the first data wiring section comprises a first data boundary adjacent to one side of the first power wiring section, and the second data wiring section comprises a second data boundary adjacent to one side of the first power wiring section; and in a thickness direction of the display panel, the pixel electrode overlaps the first power boundary, overlaps the first data boundary, and does not overlap the second data boundary, wherein a minimum distance between the first power boundary and the first data boundary overlapping a same pixel electrode as the first power boundary is d1, and a minimum distance between a first virtual boundary and the first power boundary is d2, wherein d1<d2; and in a first direction, the first virtual boundary overlaps the first power boundary, and in a second direction, the first virtual boundary overlaps an extension line of the second data boundary, wherein the first direction intersects the second direction, the plurality of data signal lines are arranged in the first direction, and the plurality of data signal lines extend in the second direction.

2. The display panel of claim 1, wherein two pixel electrodes adjacently disposed in the first direction comprise a first pixel electrode and a second pixel electrode, and a maximum distance between a first power boundary overlapping the first pixel electrode and a first data boundary overlapping the second pixel electrode is d3, wherein d3>d2.

3. The display panel of claim 1, wherein pixel electrodes of the plurality of light-emitting elements comprise a third pixel electrode and a fourth pixel electrode;

an area of a region in the third pixel electrode overlapping a first power wiring section and a first data wiring section is S1, and an area of the third pixel electrode is S2; and an area of a region in of the fourth pixel electrode overlapping a first power wiring section and a first data wiring section is S3, and an area of the fourth pixel electrode is S4, wherein $$|(S1/S2)-(S3/S4)|/(S1/S2) \leq 50\%.$$

4. The display panel of claim 3, wherein S1/S2=S3/S4.

5. The display panel of claim 1, wherein the display panel further comprising a filter unit located on one side of the light-emitting element facing away from a pixel circuit of the plurality of pixel circuits, wherein in the thickness direction of the display panel, the filter unit at least partially overlaps the pixel electrode.

6. The display panel of claim 2, wherein the data signal line comprises a wiring portion and a via connection portion electrically connected to the wiring portion; and the pixel circuit comprises a data write transistor, wherein the data signal line is electrically connected to a first electrode of the data write transistor through the via connection portion; and the first data wiring section comprises the via connection portion.

7. The display panel of claim 6, wherein in the thickness direction of the display panel, the first data wiring section overlaps the first electrode of the data write transistor.

8. The display panel of claim 6, wherein the pixel circuit further comprises an initialization transistor, wherein a first electrode of the initialization transistor is electrically connected to an initialization signal line; and in the thickness direction of the display panel, the first power wiring section overlaps the first electrode of the initialization transistor.

9. The display panel of claim 8, wherein the power signal line further comprises a second power wiring section electrically connected to the first power wiring section, wherein the plurality of power signal lines comprise first power signal lines, a first power signal line of the first power signal lines comprises the second power wiring section, and in the first direction, the second power wiring section of the first power signal line overlaps the second data wiring section; and the second power wiring section of the first power signal line comprises a second power boundary adjacent to one side of the first data wiring section;

the first power boundary is located on one side of the second power boundary facing away from the first data wiring section;

the first data boundary is located on one side of the second data boundary adjacent to the first power wiring section; and in the thickness direction of the display panel, the first power boundary and the first data boundary overlap a same pixel electrode.

10. The display panel of claim 9, wherein the display panel comprises a plurality of repetitive light-emitting element groups, and the plurality of repetitive light-emitting element groups are arranged in an array;

a repetitive light-emitting element group of the plurality of repetitive light-emitting element groups comprises a first light-emitting element group and a second light-emitting element group, wherein the first light-emitting element group comprises a plurality of first light-emitting elements, and the second light-emitting element group comprises a plurality of second light-emitting elements; in the first direction, the plurality of first light-emitting elements and the plurality of second light-emitting elements are sequentially and alternately arranged, and in the second direction, a center of a first light-emitting element is staggered from a center of a second light-emitting element;

the first light-emitting element group comprises a red light-emitting element, a blue light-emitting element, and a green light-emitting element sequentially arranged in the first direction, and the second light-emitting element group comprises a green light-emitting element, a red light-emitting element, and a blue light-emitting element sequentially arranged in the first direction; and in the thickness direction of the display panel, both the first power boundary and the first data boundary overlap a pixel electrode of the blue light-emitting element.

11. The display panel of claim 8, wherein the power signal line further comprises a second power wiring section electrically connected to the first power wiring section, wherein the plurality of power signal lines comprise second power signal lines, a second power signal line of the second power signal lines comprises the second power wiring section, and in the first direction, the second power wiring section of the second power signal line overlaps the second data wiring section;

the second power wiring section of the second power signal line comprises a second power boundary adjacent to one side of the first data wiring section;

the first power boundary is located on one side of the second power boundary adjacent to the first data wiring section;

the first data boundary is located on one side of the second data boundary facing away from the first power wiring section; and in the thickness direction of the display panel, both the first power boundary and the first data boundary overlap a same pixel electrode.

12. The display panel of claim 11, wherein the display panel comprises a plurality of repetitive light-emitting element groups, and the plurality of repetitive light-emitting element groups are arranged in an array, wherein a repetitive light-emitting element group of the plurality of repetitive light-emitting element groups comprises a first light-emitting element group and a second light-emitting element group, wherein the first light-emitting element group comprises a plurality of first light-emitting elements, and the second light-emitting element group comprises a plurality of second light-emitting elements; in the first direction, the plurality of first light-emitting elements and the plurality of second light-emitting elements are sequentially and alternately arranged, and in the second direction, a center of a first light-emitting element is staggered from a center of a second light-emitting element;

the first light-emitting element group comprises a red light-emitting element, a blue light-emitting element, and a green light-emitting element sequentially arranged in the first direction, and the second light-emitting element group comprises a green light-emitting element, a red light-emitting element, and a blue light-emitting element sequentially arranged in the first direction; and in the thickness direction of the display panel, both the first power boundary and the first data boundary overlap a pixel electrode of the green light-emitting element.

13. The display panel of claim 8, wherein the power signal line further comprises a second power wiring section electrically connected to the first power wiring section, wherein the plurality of the power signal lines comprise third power signal lines, a third power signal line of the third power signal lines comprises the second power wiring section, and in the first direction, the second power wiring section of the third power signal line overlap the second data wiring section;

the second power wiring section of the third power signal line comprises a second power boundary adjacent to one side of the first data wiring section;

the first power boundary is located on one side of the second power boundary facing away from the first data wiring section;

the first data boundary is located on one side of the second data boundary facing away from the first power wiring section; and in the thickness direction of the display panel, the first power boundary overlaps the first pixel electrode, and the first data boundary overlaps the second pixel electrode.

14. The display panel of claim 13, wherein the display panel comprises a plurality of repetitive light-emitting element groups, and the plurality of repetitive light-emitting element groups are arranged in an array, wherein a repetitive light-emitting element group of the plurality of repetitive light-emitting element groups comprises a first light-emitting element column, a second light-emitting element column, a third light-emitting element column, and a fourth light-emitting element column arranged in the first direction, wherein the first light-emitting element column and the third light-emitting element column are arranged in a same manner and each of the first light-emitting element column and the third light-emitting element includes one red light-emitting element and one green light-emitting element arranged in the second direction;

each of the second light-emitting element column and the fourth light-emitting element column includes one blue light-emitting element, and a blue light-emitting element in the second light-emitting element column and a blue light-emitting element in the fourth light-emitting element column are staggered in the first direction; and in the thickness direction of the display panel, the first power boundary overlaps a pixel electrode of the green light-emitting element, and the first data boundary overlaps a pixel electrode of the blue light-emitting element.

15. The display panel of claim 8, wherein the power signal line further comprises a second power wiring section electrically connected to the first power wiring section, wherein the plurality of the power signal lines comprise fourth power signal lines, a fourth power signal line of the fourth power signal lines comprises the second power wiring section, and in the first direction, the second power wiring section of the fourth power signal line overlaps the second data wiring section;

the second power wiring section of the fourth power signal line comprises a second power boundary adjacent to one side of the first data wiring section;

the first power boundary coincides with an extension line of the second power boundary;

the first data boundary is located on one side of the second data boundary adjacent to the first power wiring section; and in the thickness direction of the display panel, both the first power boundary and the first data boundary overlap the same pixel electrode.

16. The display panel of claim 15, wherein the display panel comprises a plurality of repetitive light-emitting element groups, and the plurality of repetitive light-emitting element groups are arranged in an array;

a repetitive light-emitting element group of the plurality of repetitive light-emitting element groups comprises a first light-emitting element column, a second light-emitting element column, a third light-emitting element column, and a fourth light-emitting element column arranged in the first direction, wherein the first light-emitting element column and the third light-emitting element column are arranged in a same manner and each of the first light-emitting element column and the third light-emitting element column includes one red light-emitting element and one green light-emitting element arranged in the second direction;

each of the second light-emitting element column and the fourth light-emitting element column includes one blue light-emitting element, and a blue light-emitting element in the second light-emitting element column and a blue light-emitting element in the fourth light-emitting element column are staggered in the first direction; and in the thickness direction of the display panel, both the first power boundary and the first data boundary overlaps a pixel electrode of the blue light-emitting element.

17. The display panel of claim 8, wherein the power signal line further comprises a second power wiring section electrically connected to the first power wiring section;

in the thickness direction of the display panel, the second power wiring section overlaps a gate of the initialization transistor; and a line width of the second power wiring section is larger than or equal to a line width of the first power wiring section.

18. The display panel of claim 17, wherein the pixel circuit further comprises a driving transistor;

the pixel circuit further comprises a first capacitor connected in series between a gate of the data write transistor and a gate of the driving transistor; and the power signal line further comprises a third power wiring section overlapping the first capacitor, and in the first direction, a line width of the third power wiring section is larger than the line width of the second power wiring section.

19. The display panel of claim 1, wherein the pixel circuit comprises a first type transistor and a second type transistor, wherein the first type transistor comprises a polysilicon active layer and the second type transistor comprises an oxide semiconductor active layer.

20. A display device, comprising a display panel, wherein the display panel, comprising: a display region comprising a plurality of light-emitting elements and a plurality of pixel circuits, wherein the plurality of light-emitting elements are electrically connected to the plurality of pixel circuits, respectively; and the display panel further comprising a plurality of power signal lines and a plurality of data signal lines located in the display region, wherein the plurality of power signal lines are electrically connected to the plurality of pixel circuits, the plurality of data signal lines are electrically connected to the plurality of pixel circuits, and the plurality of power signal lines and the plurality of data signal lines are disposed in a same layer;

a light-emitting element of the plurality of light-emitting elements comprises a pixel electrode, a power signal line of at least part of the power signal lines comprises a first power wiring section, and a data signal line of at least part of the data signal lines comprises a first data wiring section and a second data wiring section electrically connected to the first data wiring section; the first power wiring section comprises a first power boundary adjacent to one side of the first data wiring section, the first data wiring section comprises a first data boundary adjacent to one side of the first power wiring section, and the second data wiring section comprises a second data boundary adjacent to one side of the first power wiring section; and in a thickness direction of the display panel, the pixel electrode overlaps the first power boundary, overlaps the first data boundary, and does not overlap the second data boundary, wherein a minimum distance between the first power boundary and the first data boundary overlapping a same pixel electrode as the first power boundary is d1, and a minimum distance between a first virtual boundary and the first power boundary is d2, wherein d1<d2; and in a first direction, the first virtual boundary overlaps the first power boundary, and in a second direction, the first virtual boundary overlaps an extension line of the second data boundary, wherein the first direction intersects the second direction, the plurality of data signal lines are arranged in the first direction, and the plurality of data signal lines extend in the second direction.

* * * * *